US005140493A

United States Patent [19]

Janicek

[11] Patent Number: 5,140,493

[45] Date of Patent: Aug. 18, 1992

[54] CONTROL SYSTEM, METHOD OF OPERATING AN ARTICLE CLEANING APPARATUS AND CONTROLLED ARTICLE CLEANING APPARATUS

[75] Inventor: Alan J. Janicek, Morrison, Ill.

[73] Assignee: General Electric Company, Fort Wayne, Ind.

[21] Appl. No.: 260,834

[22] Filed: Oct. 21, 1988

[51] Int. Cl.[5] ...................... H01L 41/04; H01L 41/09

[52] U.S. Cl. .................................... 361/211; 310/332; 310/317

[58] Field of Search .............. 134/570, 25.2; 68/12 R; 8/159; 34/44; 310/317, 330, 332; 361/206, 208, 211; 200/181; 307/38, 115, 141, 141.4

[56] References Cited

U.S. PATENT DOCUMENTS

| | | | |
|---|---|---|---|
| 3,790,815 | 2/1974 | Karklys | 307/141 |
| 4,224,530 | 9/1980 | Simcoe et al. | 307/141 |
| 4,245,310 | 1/1981 | Kiefer | 364/400 |
| 4,275,508 | 6/1981 | Jones | 34/43 |
| 4,286,443 | 9/1981 | Hunter | 68/12 R |
| 4,437,325 | 3/1984 | Hershberger | 68/23.7 |
| 4,654,555 | 3/1987 | Ohba et al. | 310/332 |
| 4,658,154 | 4/1987 | Harnden et al. | 307/132 R |
| 4,670,682 | 6/1987 | Harnden et al. | 310/332 |
| 4,689,517 | 8/1987 | Harnden et al. | 310/332 |
| 4,819,126 | 4/1989 | Kornrumpf et al. | 361/207 |

OTHER PUBLICATIONS

Technical paper entitled "Ultra-low Power Consumption Relay with Piezo-Actuator", Omron Tateisi Electronics Co. Kyoto, Japan.

Technical paper entitled "Application of Piezoceramics in Relays", Electrocomponent Science and Technology, 1976, vol. 3.

*Primary Examiner*—J. R. Scott
*Assistant Examiner*—David Osborn
*Attorney, Agent, or Firm*—Ralph E. Krisher, Jr.

[57] ABSTRACT

A control system for regulating electrical power input to an article cleaning apparatus employing electrically actuated loads means to provide multiple processing modes of operation, including clothes washing, dishwashing and clothes drying type apparatus, uses multiple piezoceramic relay means enabling connection of the power source to each load. The electrical power is applied to the individual load with an individual piezoceramic bender member responsive to control signals and with the control circuitry being directly and ohmically connected to the power source. In one embodiment, the piezoceramic bender members are actuated with control circuitry employing user selection circuits and function control circuits which are operatively associated with power switching circuits to enable automatic operation of the particular apparatus. The piezoelectric relay comprises one or more piezoelectric bender members each connected to a spring which serves as a power conductor to the movable contact. Circuitry causes each bender member to aid each spring in pulling the movable contact away from a stationary contact upon relay opening for reliability. A method of operating the controlled apparatus in such manner and an apparatus having such controls are also disclosed.

68 Claims, 7 Drawing Sheets

CONTROL SYSTEM, METHOD OF OPERATING AN ARTICLE CLEANING APPARATUS AND CONTROLLED ARTICLE CLEANING APPARATUS

The assignee of this application also owns application Ser. No. 07/562,712, filed Aug. 6, 1990, which is a continuation of Ser. No. 07/173,491, filed Mar. 25, 1988, now abandoned, and U.S. Pat. No. 4,967,568.

This invention relates to power switching circuitry employing multiple piezoceramic relay means and more specifically to the control of a particular type apparatus with such means.

BACKGROUND OF THE INVENTION

Conventional article cleaning and drying apparatus employing electrically actuated functional means, such as clothes washers, dishwashers and clothes dryers, now enable automatic operation by a user with preselection of the desired processing modes and processing conditions. For example, a user can now automatically operate a conventional clothes washer and similar fabric article cleaning apparatus with an initial selection of the desired mode of operation such as a wash, rinse and spin cycle, as well as further preselect the processing conditions such as wash temperature, liquid levels and time duration for these selected operating modes. In a similar manner, selection of the operating modes in a conventional automatic dishwasher to include wash, rinse and the operating temperatures and time intervals for carrying out the preselected operating cycles. Moreover, conventional automatic clothes dryers now provide both time controlled and non-time controlled operation with a user also being enabled to preselect a termination of the drying cycle when a predetermined moisture content has been reached in the fabric articles being dried. It is further customary in such conventional article cleaning apparatus to perform preselected multiple modes of operation with a variety of electrically actuated functional means and which generally includes a rotatable device such as a wash tub, wash arm or drum member being employed depending upon the type of article cleaning apparatus involved. Automatic function control of the user selected processing modes is also now achieved in a conventional article cleaning apparatus with a variety of well known electrical control techniques to include temperature control circuits, timer circuits, pressure control means and still other type sensor operated circuitry. The function control is typically exercised in such conventional article cleaning apparatus by regulating electrical power to the selected functional means with some form of operatively associated relay means.

Piezoelectric relay devices are recognized to provide a means for either initiating or interrupting current flow to a load device. A known piezoceramic type relay device for this purpose is disclosed in U.S. Pat. Nos. 4,670,682 and 4,689,517, both assigned to the assignee of the present invention. The relay device includes a piezoceramic bender member formed by at least two planar piezoceramic plate elements secured in opposed parallel relationship sandwich fashion on opposite sides of at least one central conductive surface and having outer conductive surfaces that are insulated from each other and the central conductive surface by the respective intervening piezoceramic plate element thicknesses. Movable contacts associated with the movable bender coact with fixed contacts disposed thereby to either complete or interrupt an electrical circuit providing a current flow from a power source to the load device. A representative form of this type relay device as disclosed in the above mentioned prior art patents employs a piezoceramic bender member which is selectively prepoled with clamping means secured at non-poled portions adjacent to and mechanically supporting the selectively polarized bender member in a cantilever manner for operating pairs of coacting electrical contact means and with the non-poled portions being mechanically unstrained and electrically neutral. The bender member is made to operate either side of a center position normally assumed by the bender member in an unenergized condition to thereby enable different modes of operation. In one mode of operation, the relay device can simply serve as an on-off switch wherein one pair of coacting switch contacts either makes or breaks the electrical circuit with respect to the load device. In a different mode of operation, however, the pair of coacting switch contacts is provided on each side of the bender member to enable selective energization of multiple load devices. Both modes of operation with the prior art "bimorph" type bender switching devices are further said to be conducted in a similar manner wherein the DC energizing potential used to actuate deflection of the bender member has the same polarity as the polarity of the potential used to polarize the piezoceramic plate elements. The depolarization avoided by operating the relay devices in this manner provides dipole enhancement enabling relatively long term operation with load devices employing load voltages as high as 5000 volts and corresponding currents as high as hundreds of amperes.

In both above defined modes of operation, such piezoceramic relay devices have been recognized to afford major operational and structural advantages over either electromagnetic (EM) relays or semiconductor devices when employed in power switching applications. These advantages are reported in U.S. Pat. No. 4,658,154, also assigned to the assignee of the present invention, which further includes disclosure of piezoceramic relay switching circuits providing control of single and double load apparatus. The EM relays still widely employed for this purpose provide an interface between, for example, an electronic control circuit and a load circuit wherein the former handles the low power control signals for selectively energizing the relay coil to appropriately position the relay contacts coacting in the power circuit to switch relatively higher levels of power. When such relay contacts are closed, load current is conveyed, with virtually no losses and when they are parted load current is interrupted with the certainty only an air gap can provide. Over the years improvement in EM relays have resulted in increased efficiency and reduced physical size. That is, such relays can be actuated with control signals of rather low energy content to switch reasonably high levels of load current. For example, EM relays are available which can be actuated with a one watt control signal to switch several kilowatts of power at 115 or 230 volts AC. As a consequence, EM relays can be operated with signals generated by solid state control circuitry. On the other hand, the drawbacks associated with EM relays employed for controlling current flow in load circuits responsive to control signals still remains substantial. While current EM relays have been miniaturized as compared to earlier designs of such relays, their actuating power requirements are still quite large in contrast, for example, to state of the art solid state power switches. The current EM relays are still relatively complex and expensive to manufacture, for example, their coils typically require a multitude of turns of very fine wire. The coil resistance consumes some power which must be provided by a reasonably stiff power supply. When, for example, EM relays are utilized in home appliance controls, relay operating power must be derived from a 115 or 230 volt AC utility source. The requisite power supply, particularly when an EM relay is operatively associated with a solid state control circuit, requires a transformer, electrolytic capacitors, regulators and protection to insure a reliable source of relay actuating current. Such power supplies are both costly and constitute a significant source of power dissipation. Moreover, in certain applications where high ambient magnetic fields are present, such as in motor starter applications, EM relays must be specially shielded to discourage spurious operation. The drawbacks associated with employment of EM relays in power switching circuitry has thereby resulted in a trend toward utilizing solid state switches, such as SCRs, Triacs, Thyristors, MOSFETs, IGTs and the like as the power switching output device. While such solid state switches are becoming relatively inexpensive and may be smaller in physical size than comparably rated EM relays, they do present a rather significant "on" resistance, which, at high current levels, results in considerable power dissipation. Thus, semiconductor power switches being utilized at high current application must be properly heat-sinked for protection against thermally induced damage, and, as a consequence, with their heat-sinks can take up more physical space than do their EM relay counterparts. Moreover, solid state power switches must be protected against possible damage in spurious operation as a result of transients, electrostatic discharges (ESD) and electromagnetic interference (EMI). All these protective measures represent an additional expense. In that such solid state power switches do not impose an air gap to restrain the flow of current in their "off" condition and because of their "on" condition failure mode, Underwriters Laboratory has disapproved of their application in numerous domestic appliances. Such disapproval has only been overcome in part with a combination of the solid state switches and the EM relays in some domestic appliances so as to provide the required air gap.

All of the foregoing major disadvantages found with employment of either EM relays or semiconductor switches as the power switching output device has prompted renewed interest in piezoelectric relays, including piezoceramic devices. Recent improvements in piezoceramic materials have enhanced their electromechanical efficiency for these relay applications. Piezoceramic drive elements may be fabricated from a number of different polycrystalline ceramic materials such as barium titanate, lead zirconate titanate, lead metaniobate and the like which are precast and fired into a desired shape such as rectangular-shaped ceramic plates. The piezoceramic relay devices require very low actuating current, dissipate minimal power to maintain an actuated state and draw no current while in their quiescent or unenergized state. The electrical characteristics of the piezoceramic drive elements are basically capacitive in nature, and thus are essentially immune to ambient electromagnetic fields. Such piezoceramic relay devices can be designed in smaller physical size than comparably rated EM relays. Since piezoceramic relay devices utilize switch contacts, contact separation introdues the air gap in the load circuit as required for UL approval in domestic appliance applications. Closure of these relay contacts provides a current path of negligible resistance, and thus unlike solid state power switches, introduces essentially no loss in the load circuit. Since additional structural and operational advantages for such improved piezoceramic relay devices can be found in the aforementioned prior art U.S. Pat. Nos. 4,670,682 and 4,689,517, both disclosures are herein specifically incorporated into the present application in their entirety.

The suitability of piezoceramic relay devices in controlling current flow within a particular apparatus understandably requires still other factors to be considered. Both operational characteristics desired in the apparatus as well as environmental conditions being countered have to be satisfied. In a co-pending application Ser. No. 173,502, filed Mar. 25, 1988, and assigned to the present assignee, there is disclosed a control system for regulating electrical power input to the refrigeration mechanism or defrost mechanism in an atmospheric cooling apparatus, including domestic refrigeration appliances, which employs at least one piezoceramic relay device. In one embodiment, the control means employs individual piezoceramic relay devices for power regulation to the respective mechanisms while in a different embodiment a single piezoceramic relay device regulates power input between the refrigeration mechanism and defrost mechanism. In still another co-pending application Ser. No. 173,491, also filed Mar. 25, 1988, and assigned to the present assignee, there is disclosed a different control system for regulating electrical power input to the resistive heating elements of an electrical heating apparatus, including domestic cooking appliances, which employs at least one piezoceramic relay device. In one embodiment, the control means employs individual piezoceramic relay devices for power regulation to the individual heating elements while in a different embodiment a single piezoceramic relay device regulates power input to a pair of the heating elements. The circuitry actuating the piezoceramic relay devices in both of these control systems can be directly and ohmically connected to the power source in order to draw minimal actuating power directly from conventional 115 or 230 volt AC residential power sources. Since further operational and structural advantages for the disclosed control systems can be found in the aforementioned commonly assigned co-pending applications, both disclosures are also hereby specifically incorporated into the present application in their entirety. It will be apparent from the foregoing considerations as well as use already being made of piezoceramic relay devices in various type domestic appliances employing electrically actuated functional means that electrical power regulation in still different type apparatus can be more effectively provided with piezoceramic relay means.

It is a principal object of the present invention, therefore, to provide a more energy efficient system for the regulation of electrical power in an article cleaning apparatus employing multiple processing modes which are provided with electrically actuated functional means.

It is still another important object of the present invention to provide control means employing a plurality of piezoceramic relay means to regulate electrical power input in an article cleaning apparatus employing multiple processing cycles conducted with electrically actuated functional means.

Still another important object of the present invention is to provide improved electronic control means for automatic regulation of electrical power in an article cleaning apparatus employing multiple processing cycles provided with electrically actuated functional means.

A still further important object of the present invention is to provide a novel method for regulation of electrical power in an article cleaning apparatus employing multiple processing cycles achieved with electrically actuated functional means.

Still another important object of the present invention is to provide a method of operating piezoceramic relay means to more efficiently regulate electrical power input to an article cleaning apparatus having multiple processing cycles conducted with electrically actuated functional means.

Still another important object of the present invention is to provide a more efficient method to automatically regulate power input in an article cleaning apparatus employing multiple processing cycles which are provided with electrically actuated functional means.

Another important object of the present invention is to provide a more efficient article cleaning apparatus utilizing novel control means to more effectively regulate electrical power input to a plurality of electrically actuated functional means providing multiple processing cycles in the apparatus.

Another important object of the present invention is to provide control means regulating electrical power input in an article cleaning apparatus utilizing multiple processing cycles provided with electrically actuated functional means in a manner avoiding unintended simultaneous operation of the respective functional means.

Still another important object of the present invention is to provide an electrically operated article cleaning apparatus employing multiple processing cycles with simpler and lower cost control means to regulate electrical power input in the apparatus.

A still further important object of the present invention is to provide an electrically operated article cleaning apparatus employing multiple processing cycles with improved electronic control means to automatically regulate electrical power input to the individual processing means.

Another object of the present invention is to provide an electrically operated fabric laundering apparatus utilizing novel control means regulating the electrical power input.

Another important object of the present invention is to provide an electrically operated dishwashing apparatus utilizing novel control means regulating the electrical power input.

Still another important object of the present invention is to provide an electrically operated fabric drying apparatus utilizing novel control means regulating the electrical power input.

These and still other objects of the present invention will become apparent upon considering the following detailed description for the present invention.

SUMMARY OF THE INVENTION

Novel control means have now been discovered for regulating the electrical power input in various type article cleaning apparatus employing multiple processing modes conducted with electrically actuated functional means. In one aspect of the invention, improved power regulation is provided in general with user operable input selection means enabling the user to select the desired processing modes in the apparatus, multiple piezoceramic relay means being connected in circuit relationship to enable connection of the power source to each functional means responsive to electrical control signals from a plurality of relay control circuits, each relay control circuit regulating electrical power input to an individual functional means with an individual movable prepoled piezoceramic bender member, each piezoceramic bender member being formed with at least two planar piezoceramic plate elements secured in opposed parallel relationship sandwich fashion on opposite sides of at least one central conductive surface, each piezoceramic bender member further including terminal means for connection to the power source and movable electrical contact means which coact with fixed electrical contact means disposed thereby, the fixed electrical contact means being connected to terminal means of an individual functional means, and each piezoceramic bender member maintaining the movable electrical contact means spaced apart from the fixed electrical contact means while in an unenergized condition, and each control circuit being directly and ohmically connected to the power source and the terminal means of the piezoceramic bender member connected thereto for response to input control signals to actuate an individual piezoceramic bender member and cause the actuated bender member to deflect and complete a circuit between the power source and the terminal means of the selected functional means. Also in general, the actuating control signals regulate the time interval for a selected processing mode as well as provide temperature control when the particular processing mode or cycle is being conducted at elevated temperatures. For example, employment of such control means in a typical automatic clothes washer appliance wherein an aqueous cleaning agent is generally employed and removed during the article cleaning process while further including at least one preselected processing time interval and at least one preselected processing temperature can enable the entire wash, rinse and spin cycles to be automatically performed in the apparatus without further attention by the user. In accordance with one preferred embodiment of the present control means, the user need only select the desired processing cycle such as wash, rinse and/or spin while further preselecting the processing conditions already available in a typical apparatus of this type for control of a selected processing mode or modes in order to conduct an entirely automatic washing treatment. Also in general and in one form of the invention, the selected piezoceramic bender members can have different physical dimensions based upon the load circuit power requirements so that higher power levels are connected to a selected functional means with larger area bender members. The electrical power is applied or interrupted with the selected piezoceramic bender members in various ways employing DC energizing potential provided with operatively associated control circuitry and to include the control circuitry described more fully in the above referenced patents and pending applications. As therein disclosed, the piezoceramic bender members are actuated by switching the DC energizing potential from a piezoceramic plate element disposed on one side of the central conductive surface to a piezoceramic plate element on the opposite side of the central conductive surface.

Temperature control signals are employed in accordance with various aspects of the present invention. Accordingly, in one form the present control circuitry can be made responsive to control signals derived with temperature sensing means so that a temperature achieved when a selected processing mode is being operated at elevated temperatures can be determined with temperature feedback control. A more precise temperature control can also be achieved in the article cleaning apparatus according to various aspects of the present invention whereby solid state temperature sensing means, such as a thermistor device can be utilized in the control circuitry. The previously mentioned low power operating characteristics of a piezoceramic relay device makes it an ideal switching means to be operated with low power solid state drive circuits of many types. Moreover, such drive circuits can be either of a "low-drain" or "high-drain" operating characteristic with the low drain type using more components but using less current than with a high-drain circuit which has few components but uses more current thereby requiring a stiffer power supply than that required for an equivalent rated low-drain circuit. A typical relay drive circuit means for the above illustrated control system can simply include a diode-capacitor network for developing high voltage DC energizing potential in the range of about 300 volts as required for piezoceramic bender devices now commercially available, when such control means for the article cleaning apparatus is being operated from a 115 AC power supply. In such drive circuit means, series connected isolating resistor means can be provided to limit the current drawn from such AC power source while charging resistor means can also be provided to conduct the energizing potential to the piezoceramic bender member. Such drive circuit embodiments can also include further resistor means to discharge the first piezoceramic plate element when energization thereof has been terminated along with second resistor means to discharge the second piezoceramic plate element when its energization has been terminated. Automatic switching of the relay contacts can also be provided with operatively associated logic type solid state circuit means, as hereinbefore indicated, such as with various already available integrated chip devices. For example, a CMOS control circuit can be programmed in a known manner with all of the temperature and timing values enabling regulation of a controlled article cleaning apparatus in a fully automatic manner. Such representative digital or analog integrated circuit means can be simply programmed in a known manner to provide all of the timing, temperature sensing measurements and relay drive functions with a minimal number of external circuit components being required to do so. The use of on-chip or integral temperature sensing eliminates need for separate packaging in connection with sensor and biasing components otherwise required. Representative control circuitry can further employ high voltage solid state active devices such as transistors and the like to actuate the presently available piezoceramic bender members with DC energizing potential. Accordingly, various solid state chip devices are suitable in the present overall control circuitry to drive the multiple piezoceramic relay means directly from the chips such as that provided with high voltage MOS technology which is already available in commercial manufacture. To further illustrate, one such commercially available chip device is reported to achieve 500 volts, and utilizes low current drain (10–20 milliamperes) drive transistors for the active devices which may be further located on the chip. In a similar manner other known integrated chip devices can be programmed to derive all of the timing, temperature measurement and relay drive functions needed in the present control circuitry. For example, it would also be possible to use a simple CMOS microprocessor-control based chip having the capability for on-board analog-to-digital conversion such that the user setpoint and temperature feed-back signals can be converted within this controller with a minimum of external components. It will also be apparent that various type semiconductor elements other than transistors can be employed for the active devices in the above illustrated high voltage type control circuitry. Accordingly, numerous processes are known for producing high voltage, low current devices applicable for a solid state control circuit implementation such as CMOS, DMOS, PHMOS and NMOS, etc. It should be appreciated in connection with the foregoing described illustrative control circuitry, however, that future improvements can be expected to significantly lower the 300 volt DC energizing potential levels now being experienced with commercially available piezoceramic materials. From such consideration it follows that suitable relay drive circuit means for the present control system further contemplates considerably lower DC energizing potential levels being found useful.

As above indicated, the bimorph type piezoceramic bender members found useful in the present control system can be actuated with DC energizing potential in a variety of ways. Deflection of the movable bender members with such energizing potential can be produced by supporting the individual planar members at one end in a cantilever manner with the opposite end remaining free to bend. In one mode of operation, the DC energizing potential is selectively applied between the central conductive surface and one of the piezoceramic plate elements disposed on opposite sides of the central conductive surface. By switching application of the DC energizing potential from one of the piezoceramic plate elements to the other plate element while retaining the central conductive surface as a common terminal, the bender member is caused to deflect in opposite directions. In a similar mode of operation, a top ceramic plate element can be energized with 300 volts, for example while the bottom ceramic plate element can be electrically short-circuited, causing the bimorph member to bend upward. To bend the bimorph member downward, the upper plate element can be shorted while the bottom plate is energized with 300 volts. In a dissimilar mode of operation, one ceramic plate element can be connected to the high voltage terminal while the remaining ceramic plate element is connected to the common terminal. By switching the central conductive layer between the high voltage and common, the bender member is again caused to deflect in opposite directions. Terminating application of the DC energizing potential with control signals in the above representative modes of bender operation causes the coacting contacts operatively associated therewith to open, thereby providing a relatively safe manner of regulating power input to the individual functional means in the controlled apparatus. For long term reliable performance with all of the above illustrated modes of bender operation, it has been found that stable operation further requires that the applied DC energizing potential be applied in the same direction as the initial polarization in order to preclude a dimensional shift in the piezoceramic material. When the actuating voltage is applied in the opposite direction, gradual depoling occurs in the piezoceramic material. With time, a given displacement of force will gradually reduce to zero due to such depoling effect of the applied voltage. The rate of this depoling is dependent on the original polarizing conditions and the voltage applied. For high voltage applied potential, the depoling can occur over 1-2 minutes whereas lower voltages may only release the force over a period of years. For this reason, it becomes advisable to operate the piezoceramic bender members with voltages only being applied to the bimorph plate elements in the initial polarizing direction. Applying the DC energizing potential across an individual prepoled ceramic plate element with the same polarity as the initial poling potential enhances desired dipole alignment and with the accompanying dimensional changes caused in plate dimension remaining stable over the passage of time. Such dipole enhancement thereby produces a stabilized deflection of force response so long as the bimorph piezoceramic bender member is operated with the unidirectional applied DC potential being applied in the same direction as the direction of the initial poling potential.

A variety of bimorph piezoceramic bender member constructions can also be employed in the present control system. The various structural member configurations disclosed in the above referenced commonly assigned pending applications for the bender members enable long term reliable operation in the present control system. Accordingly, a plurality of such bender member constructions are operated in the present control system in the manner described above. The present multiple piezoceramic relay means can comprise a plurality of physically separated piezoceramic bender members in accordance with one representative embodiment. In a different representative embodiment, the multiple piezoceramic relay means can employ a unitary piezoceramic body construction supported at one end with the opposite end being formed with a plurality of movable spaced apart fingerlike projections serving as the individual bender members. A still different representative embodiment for the multiple piezoceramic relay means can include at least one physically separate piezoceramic bender member supported at one end in a cantilever manner with the opposite end being free to bend and which is operatively associated with at least one piezoceramic unitary body construction supported at one end in a cantilever manner with the opposite end being free to bend and with the free end being formed with a plurality of movable spaced apart fingerlike projections serving as individual bender members. To still further illustrate such latter representative bender member combination, the physically separate bender member can be utilized in one electrically actuated circuit of the control system whereas the other multi-finger bender construction can be employed in individual control circuits of the control system to regulate power input to the remaining electrically actuated functions such as operation of a motor, resistive heating element, liquid supply and drain valves or the like. Both types of the illustrated bender members are further desirably configured in accordance with the needed power requirements of the controlled electrically actuated functional means as previously indicated. Thus, lower power operated functional means such as liquid supply means and drain valves can be operated with bender members having smaller physical dimensions than required by the bender members supplying power to generally higher wattage electrical devices such as electric motors and resistive heating elements. It follows in the same regard that a multi-finger bender member being employed in the present control system can also have finger projections of different physical dimensions.

Generally, in another additional form of the present invention, it now becomes possible to configure the entire control means for an article cleaning apparatus at a convenient central location with a minimal space and with significantly reduced wiring costs. More particularly, the conventional apparatus typically employs a number of EM relays for power regulation and with such relay devices being located at different places in the apparatus. The power demands for these relays further requires a considerable heavy power wiring being employed for the associated control circuitry. The lower power requirements and simple construction for the multiple piezoceramic relay means herein disclosed now enables the entire control means to be provided as a single plug-in module enabling repair or replacement in a far more convenient manner. The conventional apparatus further employs thermostat means for temperature control of various processing modes being conducted at elevated temperatures in order to provide control signals at sufficient power level to actuate the operatively associated EM relay devices. One drawback now experienced with such electromechanical temperature control means is lack of control outside the control temperature band of the thermostat device. Ability to actuate piezoceramic relay means with lower power level electronic circuitry enables electronic temperature control means to now be employed such as with a solid state thermistor device. Such electronic temperature sensing means provides a continuous feedback signal over a far wider temperature range than required in conventional article cleaning apparatus, and hence can serve in providing control signals based on temperature conditions occurring within and outside of the controlled temperature band. Operating the conventional article cleaning apparatus with the EM relays now in current use has an additional drawback in making the domestic appliances noisy to operate. Since one or more of such relay devices can be frequently actuated in the domestic appliances, a distinct audible noise is caused each operating cycle attributable to the impact. Accordingly, replacement of the conventional EM relay means in an article cleaning apparatus with the present control system affords several important further advantages.

In one aspect of the invention in the form of a fabric laundry apparatus employing a cleaning agent and multiple processing modes there is employed a rotatable wash tub member in which the articles are laundered and which is rotated by suitable drive means enabling different rotational speeds, user operated input selection means enabling a user to preselect the desired laundering mode and processing conditions in the wash tub member of the apparatus, each of the laundering modes utilizing electrically actuated functional means, multiple piezoceramic relay means connected in circuit relationship to enable connection of the power source to each functional means responsive to electrical control signals from a plurality of relay control circuits, each relay control circuit regulating power input to an individual functional means with an individual movable piezoceramic bender member, each piezoceramic bender member being formed with at least two planar piezoceramic plate elements secured in opposed parallel relationship sandwich fashion on opposite sides of at least one central conductive surface, each piezoceramic bender member further including terminal means for connection to the power source and movable electrical contact means which coact with fixed electrical contact means disposed thereby, the fixed electrical contact means being connected to terminal means of an individual functional means, with each piezocermaic bender member maintaining the movable electrical contact means spaced apart from the fixed electrical contact means while in an unenergized condition, and each relay control circuit being directly and ohmically connected to the power source and the terminal means of the piezoceramic bender member connected thereto for response to user preselection of processing modes and processing conditions in the apparatus, the user preselection providing electrical control signals which actuate an individual bender member and cause the actuated bender member to deflect and complete a circuit between the power source and the terminal means of the preselected functional means in accordance with the user preselected control signals. Rotational speed, processing temperature and processing time duration in the wash tub member can be regulated with the user preselected control signals to provide a laundering process which includes a wash cycle, a rinse cycle and a spin cycle. Additional control signals can be provided to enable a preliminary soaking cycle to be incorporated in the laundering process. The controlled laundering process can further be automatically carried out in such manner with user preselection of a particular fabric material being laundered. Agitation means can be further included in the wash tub member to provide forward and reverse stokes of agitation to the articles while being laundered all in an already known conventional manner. Likewise, the illustrated control embodiment can further include means to regulate the level of liquid cleaning agent, which is ordinarily an aqueous soap suspension along with the rinse liquid being provided to the wash tub member. Still other conventional electrically actuated functional means can be regulated with the illustrated control embodiment to include carrying out the washing operation at a plurality of preselected temperature settings as well as carrying out the rinsing operation again at a plurality of preselected temperature settings. Understandably, the illustrated control embodiment can further regulate a plurality of washing cycles as well as a plurality of rinsing cycles.

A different aspect of the present invention in the form of a dishwashing apparatus which employs a cleaning agent and multiple processing modes along with a rotatable wash arm which is rotated by suitable drive means enabling different rotational speeds provides the power regulation with user operable input selection means enabling the user to preselect the desired dishwashing mode and processing conditions for electrically actuated functional means, multiple piezoceramic relay means connected in circuit relationship to enable connection of the power source to each functional means responsive to electrical control signals from a plurality of control circuits, each relay control circuit regulating power input to an individual functional means with an individual movable piezoceramic bender member, each piezoceramic bender member being formed with at least two planar piezoceramic plate elements secured in opposed parallel relationship sandwich fashion on opposite sides of at least one central conductive surface, each piezoceramic bender member further including terminal means for connection to the power source and movable electrical contact means which coact with fixed electrical contact means disposed thereby, the fixed electrical contact means being connected to terminal means of an individual functional means, with each piezoceramic bender member maintaining the movable electrical contact means spaced apart from the fixed electrical contact means while in an uneneri̇gized condition, each control circuit being directly and ohmically connected to the power source and terminal means of the piezoceramic bender member connected thereto for response to user preselection of processing modes and processing conditions in the apparatus, the user preselection providing electrical control signals which actuate an individual bender member and cause the bender member to deflect and complete a circuit between the power source and the terminal means of the preselected control signals. In a representative control embodiment for such control system, the user preselected control signals regulate wash arm rotational speed, processing temperature and processing time duration so as to provide a dishwashing process which includes a wash cycle, a rinse cycle and a drying cycle. The illustrated control embodiment can further provide a dishwashing process including a preliminary rinse cycle as well as a drying cycle conducted with a moving electrically heated air stream all operated in an otherwise conventional manner. In this manner, an aqueous cleaning agent can be employed at elevated temperatures in a dishwashing process and thereafter removed from the washed dishware. Again, the wash cycle can be carried out at a plurality of preselected temperature settings while the rinse cycle can likewise be carried out at a plurality of preselected temperature settings.

In a still different aspect of the present invention in the form of a fabric drying electric apparatus employing at least one heating device (generally in the form of an electrical resistive heating element or gas valve) and multiple processing modes there is provided a control system to regulate electrical power input in accordance with the present invention which comprises in combination, a rotatable drum member in which moist fabric articles are dried with the resistive heating element and which is rotated by suitable drive means at a relatively constant rotational speed, user operable input selection means enabling the user to preselect the desired processing mode and processing conditions in the drum member of the apparatus, each of the processing modes utilizing electrically actuated functional means, multiple piezoceramic relay means connected in circuit relationship to enable connection of the power source to each functional means responsive to electrical control signals from a plurality of relay control circuits, each relay control circuit regulating power input to an individual functional means with an individual movable piezoceramic bender member, each piezoceramic bender member being formed by at least two planar piezoceramic plate elements secured in opposed parallel relationship sandwich fashion on opposite sides of at least one central conductive surface, each piezoceramic bender member further including terminal means for connection to the power source and movable electrical contact means which coact with fixed electrical contact means disposed thereby, the fixed electrical contact means being connected to terminal means of an individual functional means, with each piezoceramic bender member maintaining the movable electrical contact means spaced apart from the fixed electrical contact means while in an unenergized condition, each control circuit being directly and ohmically connected to the power source and terminal means of the individual bender member connected thereto for response to user preselection of the processing modes and processing conditions in the apparatus, the user preselection providing electrical control signals which actuates the individual bender member and causes the actuated bender member to deflect and complete a circuit between the power source and the terminal means of the preselected functional means in accordance with the user preselected control signals. In the representative control embodiment, the user preselected control signals can regulate processing temperature and processing time duration and to further include a time controlled or nontime controlled heat drying process, including combinations thereof. Both latter modes of automated control in the apparatus simply require preselection of the desired processing mode and processing conditions with such preselected functional means being converted to electrical control signals. Further incorporation of conventional moisture control means in the illustrated apparatus is contemplated with the control signals terminating the fabric drying process at preselected moisture content levels in the fabric articles. Additionally, a cool-down cycle wherein the elevated drying temperatures are reduced at a predetermined cooling rate in the controlled apparatus is contemplated with already known electrically actuated temperature control means. A still further known control feature wherein the fabric drying process is automatically controlled with user preselection of a particular fabric material to be dried can be utilized in the illustrated apparatus embodiment.

The general method of regulating power input in an article cleaning apparatus employing control means as described for any of the above illustrated embodiments thereby comprises (a) selecting a desired processing mode from a plurality of the available electrically actuated functional means, (b) converting the selected functional means to electrical control signals, and (c) actuating an individual piezoceramic bender member connected to the selected functional means with the control signals which causes the actuated bender member to deflect and complete a circuit between the power source and the selected functional means. For automatic regulation of an article cleaning process, the processing conditions are also preselected by the user so that control signals actuating the individual bender member further exercise functional control of the selected processing modes such as temperature control or time duration. As can be further appreciated in connection with such mode of regulation in the controlled apparatus, any termination of actuating potential to the actuated bender member causes deflection in the opposite direction so that the relay contacts open for a relatively fail-safe manner of opoeration. The control circuitry providing such general method of individual piezoceramic bender operation typically includes user selection circuit means and function control circuit means which are operatively associated with power switching circuit means.

BRIEF DESCRIPTION OF THE DRAWINGS

FIG. 7A is an enlarged view of a portion of FIG. 7.

DETAILED DESCRIPTION OF THE PREFERRED EMBODIMENTS

Figure 1:
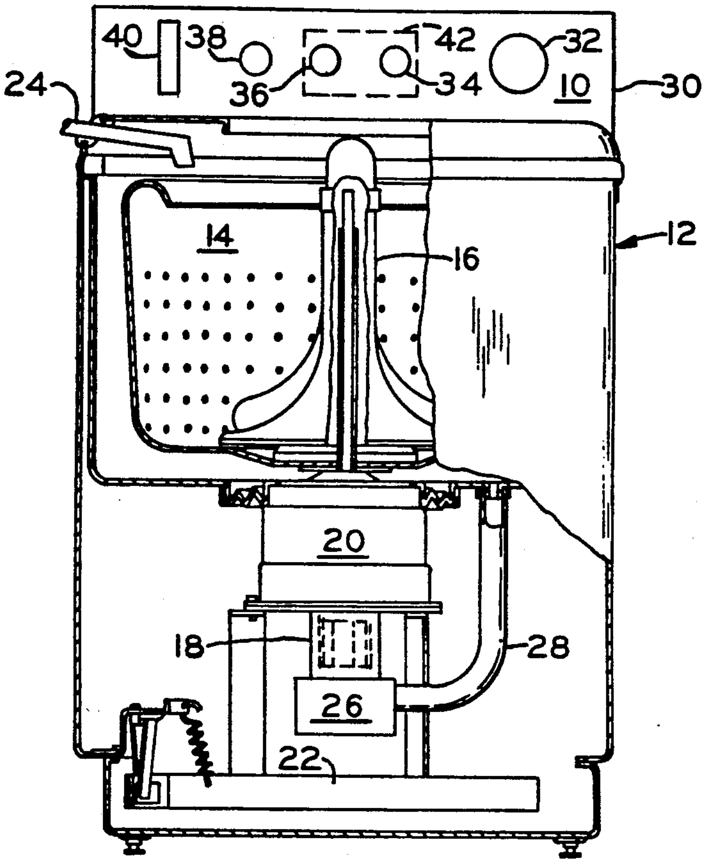
FIG. 1 is a front view representing one form of a fabric laundry appliance embodying control means according to the present invention.

Referring now more specifically to the drawings, the preferred embodiments of the present invention are illustrated in connection with an article cleaning apparatus in the form of a household fabric laundry appliance or clothes washer of the type more fully described in U.S. Pat. No. 4,437,325, issued Mar. 20, 1984 to Dorin D. Hershberger and U.S. Pat. No. 4,532,459 issued Jul. 30, 1985 to David W. Erdman et al. Both patents are assigned to the General Electric Company and both disclosures are specifically incorporated here by reference. As shown in the present FIG. 1 drawing, there is illustrated a typical laundry or washing machine 10 embodying one form of the present control means. The washing machine includes a cabinet 12 and means, such as a perforated spin tub member 14 or the like arranged within the cabinet for receiving water and clothes (not shown) to be laundered therein, the wash tub member being adapted to be unidirectionally rotatable at a velocity great enough to centrifugally displace at least some of the water from the clothes to be laundered therein. Means, such as an agitator 16 or the like for instance, arranged within receiving means or wash tub member 14 so as to be generally coaxial therewith is adapted to be oscillated, that is rotated in opposite directions for agitating the clothes in the water in effecting the laundering process. Drive means in the form of an electric motor 18 mounted within cabinet 12 provides rotation of the wash tub member in at least one preselected sequence as chosen by the user. A transmission mechanism 20 is adapted to be operatively connected between the wash tub member 14, the agitator 16 and electric motor 18 to further effect a conjoint oscillation movement thereof while the wash tub member is being unidirectionally rotated as more fully described in the above referenced 4,437,325 patent. The laundry machine 10 is further provided with a supporting frame 22 on which the transmission mechanism 20, electric motor 18 and still other conventional structural features are physically mounted to still further include a liquid pump device 26 along with liquid drain means 28. While still other conventional functional means such as bleach or fabric softener dispensers have not been included in the present drawing for the purposes of brevity in focusing upon the essential features of the present control system, it is contemplated that such components may be provided in the laundry machine and that such laundry machine may be provided with other operating modes or cycles within the scope of the invention so as to meet some of the objects thereof.

The above illustrated clothes washer further includes a control panel 30 having a plurality of manually operated control knobs 32, 34, 36 and 38 along with a touch control means 40 enable control of the washing process by a user in various ways. Specifically, manually operated or touch control devices typically provide low power inputs based upon user selections which serve as the control signals for the electrically actuated functional means in the washing machine. A user can thereby select the desired washing cycle such as regular, rinse or soak with physical movement of control knob 32 or further select the temperature or temperatures at which the selected cycles are to be carried out with physical movement of control knob 36. A still further selection by a user of the water level in the wash tub member during the selected cycles, such as large load, regular load and "Minibasket" can be made with physical movement of control knob 38. Touch control knob 40 enables the user to have a fabric wash treatment carried out automatically upon simple selection of the particular fabric involved such as cotton, knits, silks, permanent press, etc. Such selection by a user of the processing modes and processing conditions generally produces DC control signals with either potentiometer means being affixed to the manually operated control knobs or with some other well known control signal generation means. The entire power control means 42 responsive to such electrical control signals can all be conveniently located on the control panel 30 in a single boxlike enclosure as shown by dashed lines in the drawing.

Figure 2:
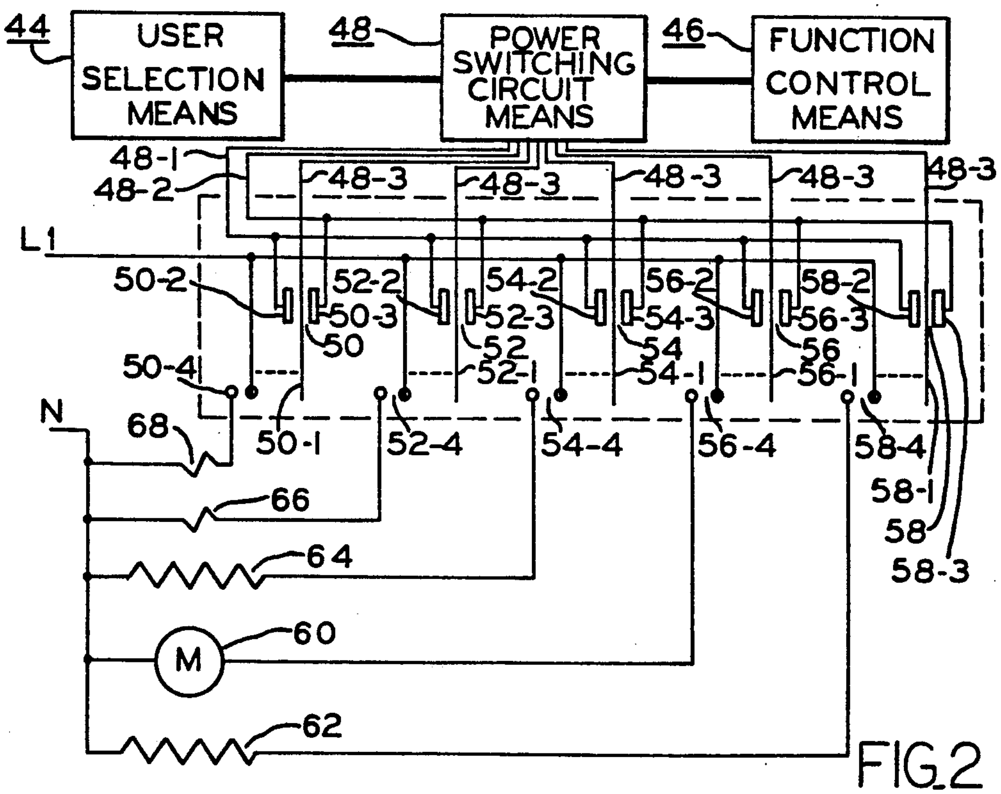
FIG. 2 is a functional block diagram for one aspect of the present control means as employed in the FIG. 1 apparatus.

A typical power regulation system employing the present control means in connection with the above described clothes washer embodiment is depicted in block diagram form in FIG. 2. Accordingly, the depicted power regulation means or system 42 includes operatively associated user selection circuit means 44 and function control circuit means 46 which are connected in circuit relationship to provide the electrical control signals to power switching circuit means 48. Selection by a user of the processing mode and processing conditions from a plurality of settings made available with the control knobs 32–40 derives the illustrated DC control signals in user selection circuit means 44 which are further processed in the function control circuit 46. Suitable function control circuit means can simply consist of a conventional analog or digital logic circuit to process all user selected control signals. The processed control signals are thereupon applied to further operatively associated power switching circuit means 48 which enables actuation of individual piezoceramic relay means 50, 52, 54, 56 and 58 for consequent electrical connection of the power source to individual electrically actuated functional means contained in the controlled apparatus embodiment. As can be noted in the drawing, an electric motor 60 provides one of the illustrated functional means whereas the remaining functional means 62, 64, 66 and 68 have all been shown simply as resistive load devices. Representative resistive load devices for the illustrated clothes washer embodiment can include agitator means, water valves, drain valves, bleach dispenser, fabric softener dispenser and the like. Depicted relay means 50–58 are series connected to an individual electrically actuated functional means for independent control of the electrical power thereto. The relay means are further constructed and operated to maintain the coacting contact means open or spaced apart when an individual piezoceramic bender member is in an unenergized condition but deflect in the previously disclosed manner to switch the associated functional means into conduction responsive to the applied electrical control signals. Operation of the individual bender members in this manner supplies the electrical power from power conductors N and L-1 which can be a conventional 115 volt AC power supply. As a further explanation for suitable operation of the herein illustrated embodiment, the present drawing depicts each relay device 50, 52, 54, 56 and 58 to have a common structural configuration which includes a pair of opposed piezoceramic plate elements joined together by a central conductive surface. Representative relay device 50 is thereby shown with central conductive surface 50-1 being sandwiched between piezoceramic plate elements 50-2 and 50-3, the relay device still further including movable coacting contact means 50-4 to be more fully explained in FIG. 3. Correspondingly, remaining relay devices 52, 54, 56 and 58 employ a like structural configuration as also shown in the present drawing. Power conductor L-1 is connected to each relay device so that engagement of an individual coacting contact means in the selected relay device completes an electrical circuit supplying power to the particular functional means individually connected thereto. Control signals for actuation of an individual relay device in the presently illustrated control means are applied in a particular manner with circuit conductors 48-1, 48-2 and 48-3. Circuit conductor 48-1 applies a control signal causing energizing potential to be supplied to one plate element of a selected relay device while a second control signal applied with circuit conductor 48-2 enables the energizing potential to be supplied to the remaining plate element of the selected relay device. A third control signal applied with an individual circuit conductor 48-3 to the central conductive surface of the selected relay device enables the energizing potential to be switched between the cooperating plate elements of the selected relay device in order to cause its coacting contact means to become engaged.

In FIG. 3 there is depicted a more detailed structural view for the hereinabove illustrated power control system 42 operating the FIG. 1 laundry appliance. As previously explained, control means 42 can all be physically incorporated into a single housing member or module which is mounted on the control panel 30 to regulate the power input to the controlled electrically actuated functional means provided in this appliance.

Figure 3A:
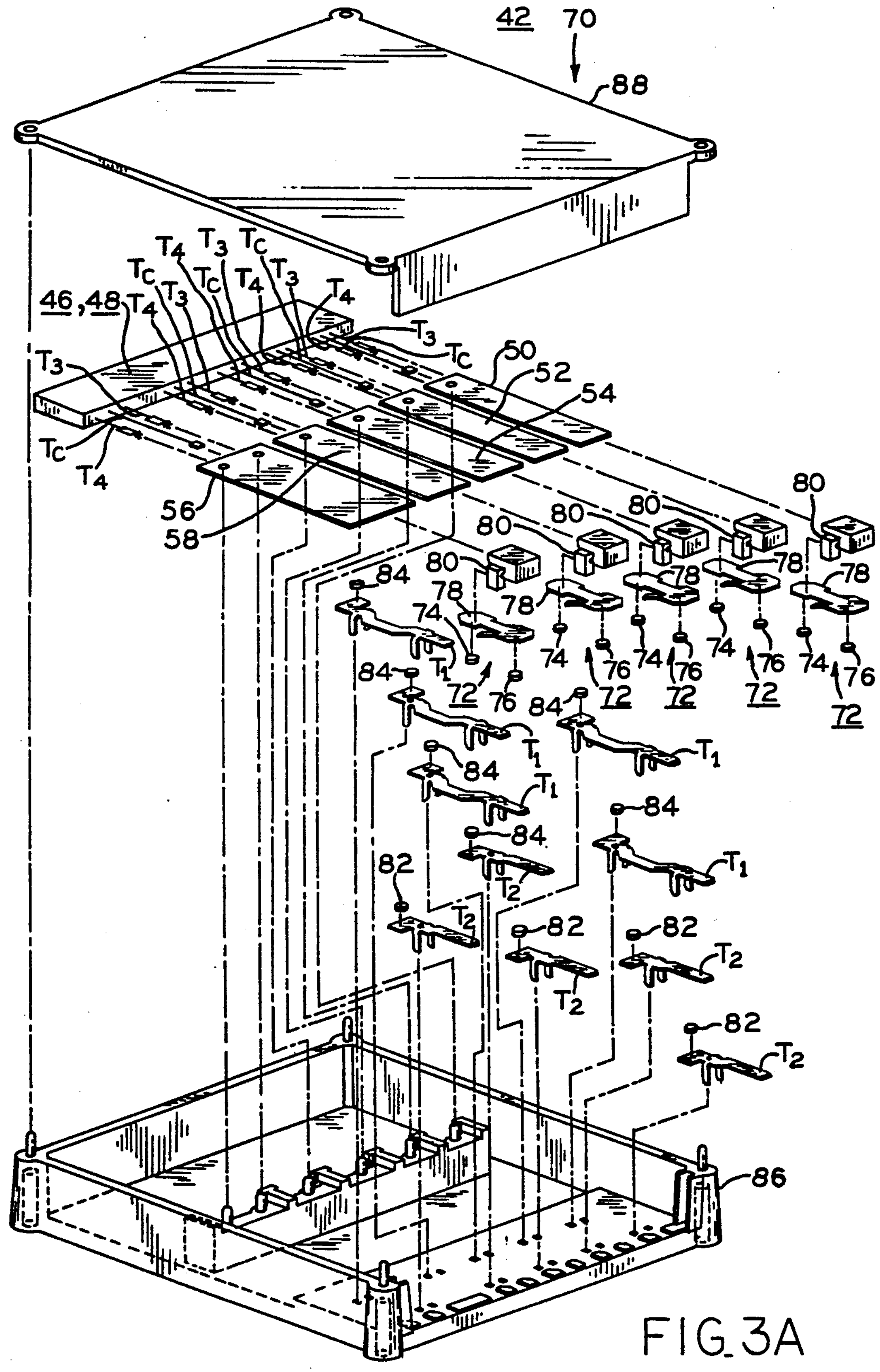
FIGS. 3A and 3B comprise exploded perspective views for two representative power switching control means which can be employed in the FIG. 1 laundry appliance.

The FIG. 3A embodiment depicts the individual bender members 50, 52, 54, 56 and 58 as physically separate from each other and with each of the bender members having power terminals $T_1$ and $T_2$ emerging from the boxlike enclosure 70 to enable connection of the power source to an individual functional means. In such manner, electrical power is supplied by individual input power terminals $T_1$ to each bender member while output power terminals $T_2$ supply this electrical power from an individual bender member to an individual functional means when the bender electrical contacts are closed. Actuation of the individual bender members whereby the operatively associated contact means 72 are opened and closed is provided with selective application of DC energizing potential to associated pairs of piezoceramic plate elements provided in the bimorph construction (not shown) by means of further internal terminals $T_3$, $T_4$ and $T_c$ also depicted in the drawing. Such energizing potential is applied responsive to the electrical control signals provided from the previously identified function control means 46 to switch circuit means 48 and which are both depicted only by a single block representation in the present drawing to simplify description of the principal relay physical components providing the illustrated power regulation. Individual contact means 72 each comprises a pair of movable contact means 74 and 76 interconnected by a conductive strip 78 and affixed to the bender member with electrically insulative support means 80. The movable contacts 74 and 76 engage fixed contacts 82 and 84, respectively, thereby completing a circuit between individual input and output terminals $T_1$ and $T_2$ when the coacting contacts are closed and supplying electrical power to the selected functional means. Representative circuit means for direct ohmic connection to the power source in order to enable operation of the controlled functional means in the foregoing manner is more fully explained hereinafter in connection with the following FIGS. 4–5 electrical circuit diagrams. The boxlike enclosure 70 includes an electrically insulative base 86 to which all previously mentioned structural components are affixed and cover means 88 to protect the housed components and operatively associated control circuitry against atmospheric contamination.

Figure 3B:
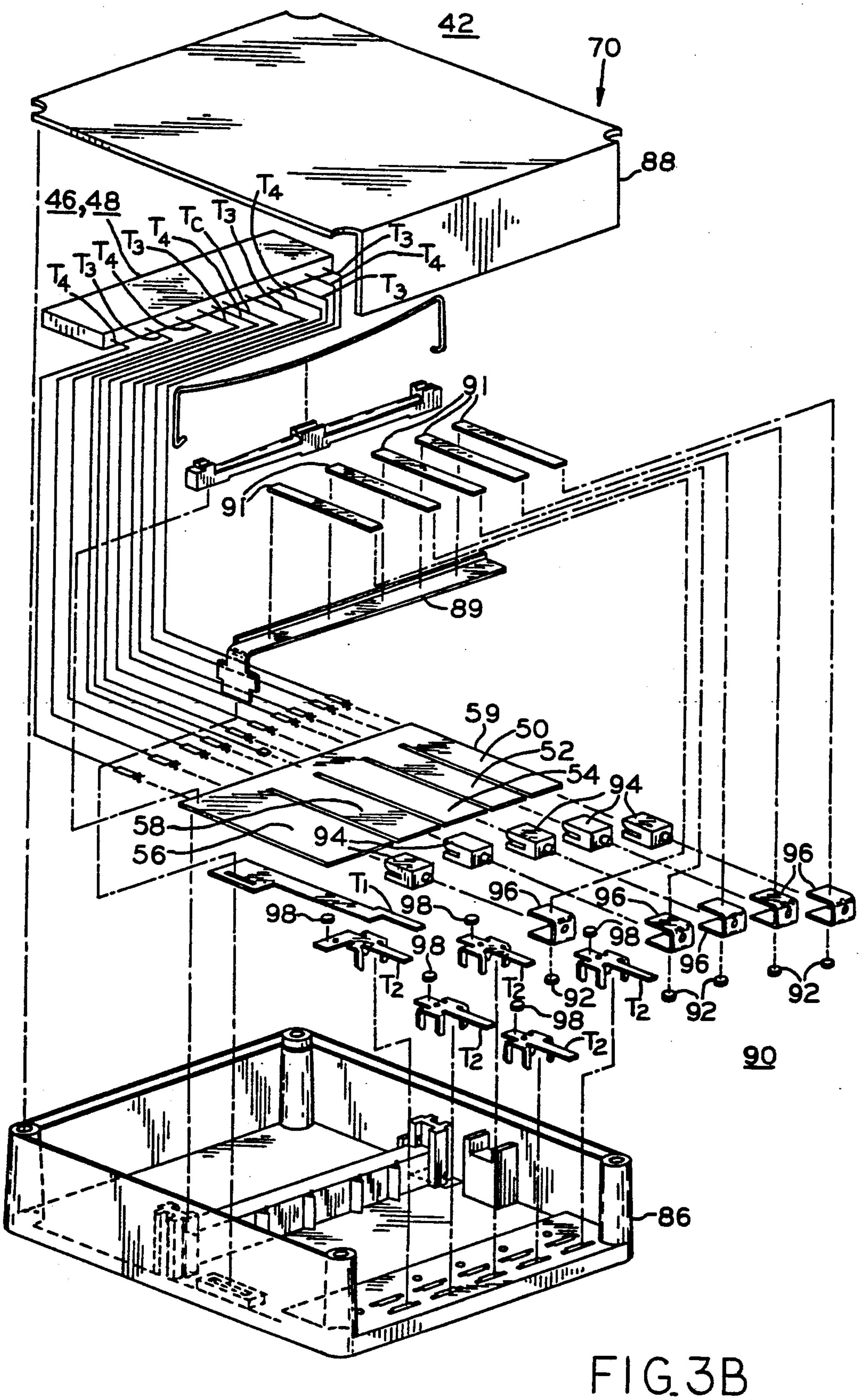

In FIG. 3B, there is depicted a structurally and functionally similar configuration for the individual bender members and associated terminal means to enable power regulation in the FIG. 1 apparatus. By reason of such general similarity in the respective control means, therefore, common numerals employed in the FIG. 3A drawing have been retained in the FIG. 3B drawing to the extent possible. Accordingly, movable finger projections 50, 52, 54, 56 and 58 all extend from a single piece 59 of the bimorph unitary body construction which has been physically supported at one end in a cantilever manner similar to that provided for the individual bender embers in the preceding embodiment. Only a single input power terminal $T_1$ is provided in the present embodiment, however, which supplies electrical power to the individual finger projections by means of a common conductive strip or clamp element 89. The individual output terminals $T_2$ associated with each finger projection are connected in circuit relationship to individual coacting contact means 90 via "flying lead" or flexible conductor elements 91 as shown in the present drawing. The present coacting contact means 90 each comprise a movable contact 92 which is secured to a finger projection with an electrically insulative element 94. A conductive strip element 96 is secured to the electrically insulative element so that one end of an individual flying lead can be secured thereto while being secured at the opposite end to the common conductive strip 89. The individual coacting fixed contacts 98 are connected in circuit relationship to the individual output terminals $T_2$ thereby enabling electrical power to be shunted to an individual functional means when the movable finger contacts are closed. Again, the actuation of the individual means proceeds with DC energizing potential being selectively applied to the associated pair of piezoceramic plate elements provided in the bimorph construction employing the internal terminals $T_3$, $T_4$ and $T_c$ shown in the present drawing. Similarly, the selective application of such energizing potential is provided with control signals derived in the further operatively associated control circuit means 46 and 48. In both illustrated embodiments, all such control signals can conveniently be derived with solid state logic circuit means to include timing, temperature control and relay drive functions required in the controlled apparatus for fully automated operation. It is further contemplated in both of these embodiments that customary electrode patterns or conductive patterns provided on one or both outer surfaces of the piezoceramic bender members, as disclosed in the previously referenced 4,680,682 and 4,689,517 patents, do not fully extend to the side edges in order to avoid possible voltage breakdown between the oppositely disposed piezoceramic plate elements. On the other hand, fully polarized, selectively polarized and even unpoled bender member constructions prove useful in the practice of the present invention. A still further comparison between the FIG. 3A and 3B embodiments finds the latter control means also fully housed in a box-like enclosure 70 having a base 86 and cover means 88 so as to enable attachment to the control panel member 30 of this appliance. Such comparison for both herein illustrated embodiments likewise finds the movable ends of the individual piezoceramic bender constructions to have physical dimensions dependent upon the particular load circuit power requirements. As therein depicted, the bender member 56 providing electrical power to the electric motor 60 in the controlled appliance has the greatest cross sectional area by reason of its highest power requirement. Bender member 58 has somewhat less cross sectional area since lesser power levels are required to operate the controlled agitator means 62 in this appliance. Similarly, the cross sectional areas of remaining bender members 50, 52 and 54 are still further reduced in proportion to required operating power levels for the water supply means 64, drain valve means 66 and soap dispenser means 68 being controlled.

Figure 4:
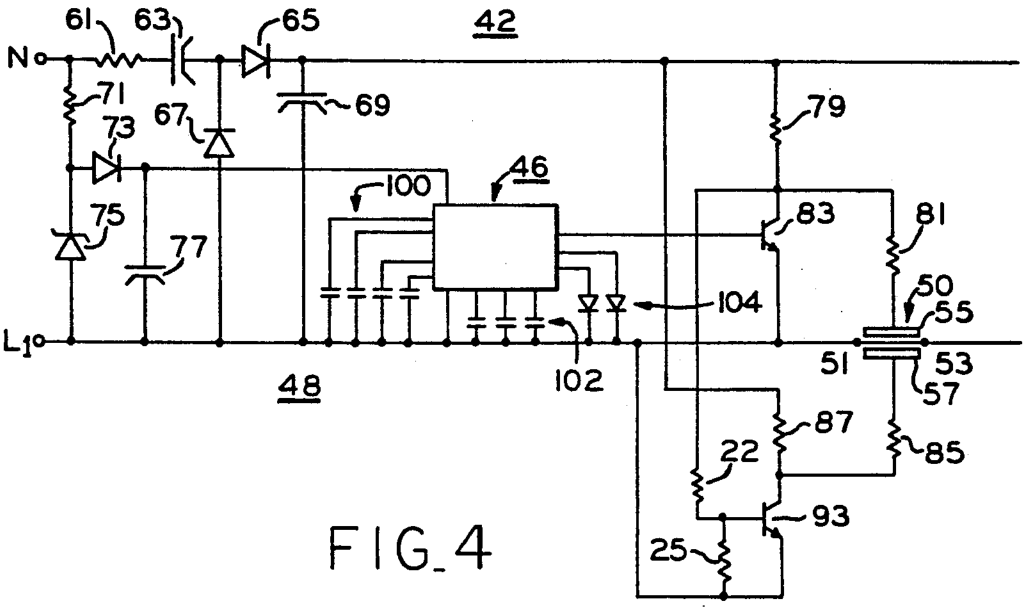
FIG. 4 is an electrical schematic diagram for a typical control circuit which can be used in the FIG. 1 apparatus.

FIG. 4 is an electrical schematic diagram representing one typical control circuitry 42 which can be employed to actuate an individual bender member or an individual bender finger element when the bender member is constructed with a plurality of spaced apart finger projections in the FIG. 1 appliance. For greater ease of understanding, the same numerals have been retained in the present Figure to identify the same structural and circuit components previously identified in the FIGS. 2–3 embodiments. A "high drain" control circuit means 42 is depicted in the present drawing wherein solid state logic circuit 46 provides the control signals to higher voltage power supply elements in the operatively associated switching circuit means 48 for actuation of the depicted individual bender member 50. To further simplify description for the illustrated control circuitry, the remaining bender members 52, 54, 56 and 58 found in the FIG. 1 appliance have not been included but it should be appreciated that all such bender members can be actuated with control signals provided with the same logic circuit 46 herein depicted. It would only be necessary for actuation of such remaining bender members that a duplication of the active devices providing DC energizing potential to the herein depicted bender member 50 be added along with associated resistor means hereinafter all to be more fully explained. Accordingly, the depicted bender member 50 is connected in circuit relationship so that its central conductive surface 51 is connected to one power conductor L-1 with the movable free bender end 53 remaining in the central open position while the opposed piezoceramic plate elements 55 and 57 remain unenergized. The aforementioned coacting contact means 72 and 82 or 92 and 98 (not shown in present drawing) which are disposed on the movable bender end enable completion of an electrical circuit to the controlled functional means 68 (also not shown in the present drawing) when such contacts become engaged. A resistor-diode network provided with circuit elements 61, 63, 65, 67 and 69 in the switching circuit means 48 forms a high voltage power supply developing the DC energizing potential to actuate the piezoceramic bender member. A low voltage power supply to the logic circuit 46 is provided with circuit elements 71, 73, 75 and 77. The DC energizing potential is applied selectively to the individual piezoceramic plate elements such that the top element 55 is charged or discharged with the central conductive surface 51 being maintained at common potential and with the same manner of operation being carried out with respect to the bottom piezoceramic plate element 57. In doing so, resistor elements 79 and 81 control charge and discharge to the top plate element when the DC potential is applied with active device 83 where as resistor elements 85 and 87 perform the same function with respect to the active device 93 providing DC potential to the bottom plate element. Circuit elements 100 and 102 provide inputs to logic, and circuit elements 104 provide display outputs. It will be recognized by reason of the preceding description pertaining to the FIGS. 1-3 embodiments that a solid state thermistor circuit can optionally be incorporated into the presently illustrated control circuitry to provide temperature feedback control with respect to operation of the controlled functional means. To do so would simply require that a solid state thermistor sensing element be placed in the desired functional means with additional resistor elements being included in the same circuitry to satisfy ballasting requirements for the control signals generated therewith being supplied to the present logic circuit 46.

Figure 5:
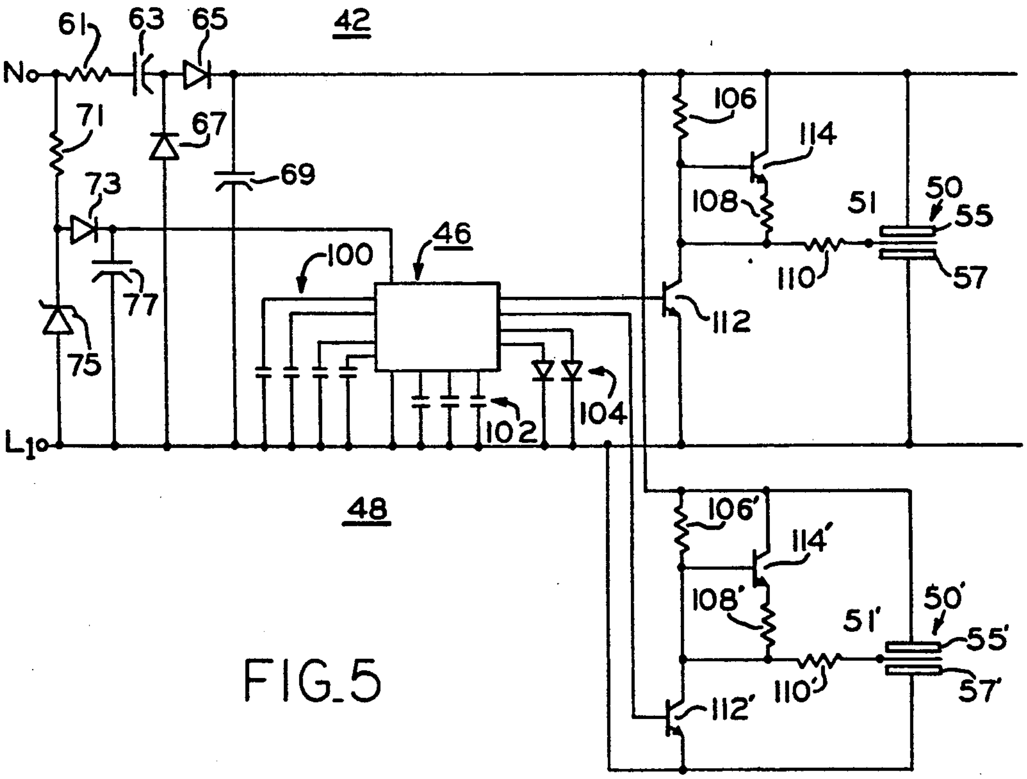
FIG. 5 is an electrical schematic diagram for a different control circuit which can be used in the FIG. 1 apparatus.

FIG. 5 is an electrical circuit diagram depicting alternate circuit means for the automated control circuitry above described in FIG. 4 wherein the presently illustrated control circuitry 42 operates a pair of piezoceramic bender members in a similar manner. Accordingly, the same numerals employed in the FIG. 4 circuit embodiment are retained to the extent possible in identifying common circuit components. With further respect to the comparable operation of such common circuit elements in the present control circuit embodiment there also need be no repetition of the FIG. 4 circuit description. The present circuit description is thereby limited to describing operational differences in the present control circuitry with respect to actuation of the individual bender members 50 and 50′. A "low drain" circuit is herein depicted with each of the bender members being connected such that the top ceramic plate element (55 or 55′) is energized with high voltage DC potential while the bottom ceramic plate (57 or 57′) is maintained at common potential and the switching of the bender member is carried out by varying the applied potential to the central conductive surface (51 or 51′) between the high voltage and common potentials. The resistor diode network again provided with circuit elements 61, 63, 65, 67 and 69 forms a high voltage power supply which develops DC energizing potential to both bender members 50 and 50′ while a low voltage power supply is again provided to the logic circuit 46 with circuit elements 71, 73, 75 and 77. The DC energizing potential is applied to bender member 50 in the hereinabove described manner with resistor elements 108 and 110 controlling charge of a pair of active transistor elements 112 and 114 as the means for doing so. Likewise, the charge and discharge rates for a second pair of active transistor devices 112′ and 114′ providing the energizing potential to bender member 50′ is regulated with resistor elements 108′ and 110′. Circuit elements 100 and 102 again provide inputs to logic while circuit elements 104 provide display outputs. Optional further limiting resistor elements are contemplated in both of the hereinabove control circuit embodiments 42 as a means to reduce circuit susceptibility to line-induced transients.

Figure 6:
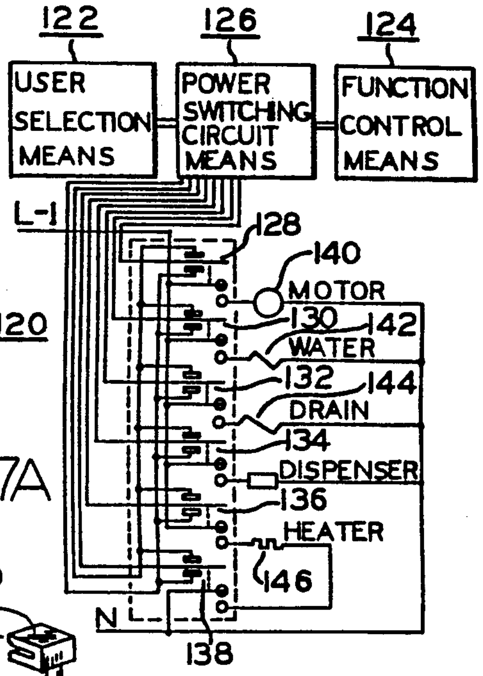
FIG. 6 is a functional block diagram for a different control means in accordance with the present invention.
Figure 6A:
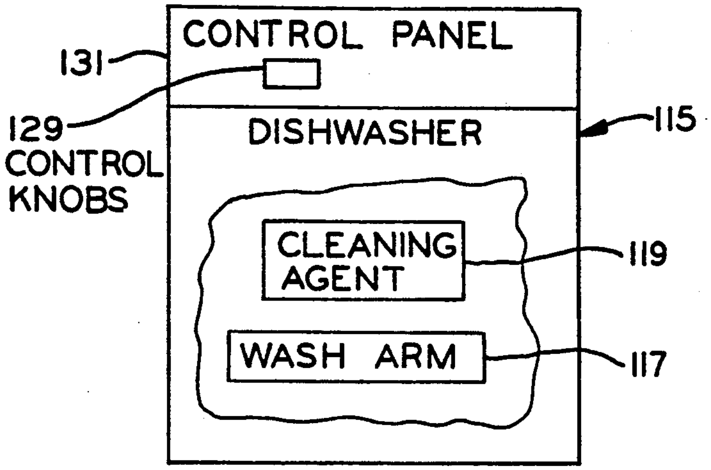
FIG. 6A is a side diagrammatic elevational view of a dishwasher of the type incorporating the present invention, with portions shown broken away for clarity.
Figure 6B:
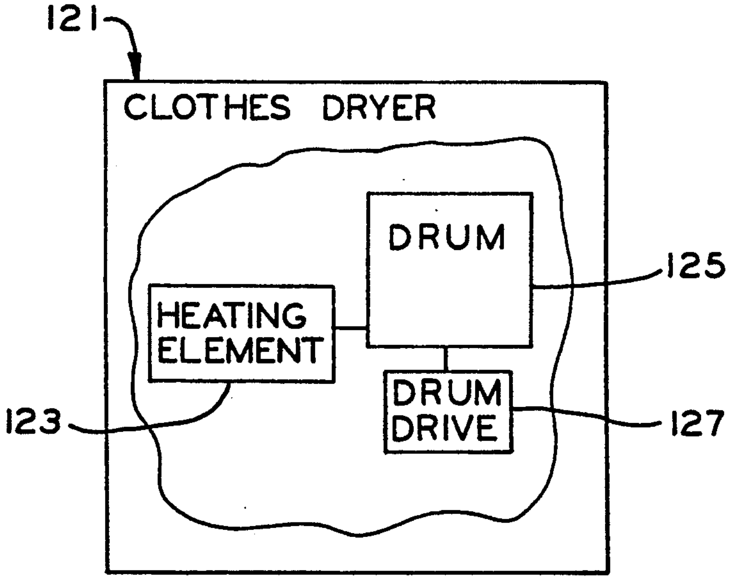
FIG. 6B is a diagrammatic side elevational view of a clothes dryer of the type incorporating the present invention, with portions shown broken away for clarity.

In FIG. 6-9 there is depicted a representative control system according to the present invention for a typical household type dishwashing appliance generally designated 115 (best seen in FIG. 6A) which employs user preselected control signals to regulate wash arm rotational speed, of a wash arm 117 processing temperature and processing time duration to provide a dishwashing process having a wash cycle, a rinse cycle and a drying cycle. The dishwasher 115 also includes a device 119 for dispensing soap or other cleaning agents. A diagrammatic representation of a clothes dryer of the type which also may incorporate the present control system is generally designated 121 (best seen in FIG. 6B) and includes at least one heating device 123, generally in the form of an electrical resistive heating element or gas valve, a rotatable drum member 125 in which moist fabric articles are dried with the heating device 123, and a conventional drive system 127 for rotationally driving the drum 125. Since the present control system may be readily incorporated into the dishwasher 115 or the dryer 121, the following discussion will refer only to the dishwasher. Certain Underwriters Laboratory (UL) constraints apply to such apparatus so that a suitable design for a particular apparatus as well as its subsequent operation minimizes risk of UL disapproval. For example, a common UL constraint upon various household appliances employing electrical resistive heating elements, such as cooking ranges, clothes dryers and others, requires both power conductors to be interrupted with an air-gap when the individual heating elements are not being operated. A different UL constraint commonly applied to domestic appliances limits the power level in the control system to a 15 watt maximum. Still further UL considerations applicable to control systems employing piezoceramic relay devices relate to maintaining both physical and electrical separation between the load devices being operated by the relay devices and the control circuitry as well as ameliorating arcing problems which can otherwise occur when opening or closing the coacting electrical contacts in such devices. In view of the foregoing considerations, the particular control system represented in FIGS. 6–9 employs control circuitry which is particularly responsive to meeting all such criteria with respect to the dishwashing appliance 115 involved. Accordingly, the electrical schematic in FIG. 6 depicting electrical connection of the individual piezoceramic relay devices being employed in the illustrated appliance 115 includes interruption of both power conductors to a resistance heating element with separate relay means. Correspondingly, the structural means depicted in FIG. 7 which houses one (1) pair of the individual piezoceramic relay devices being employed in the illustrated appliance 115 does not further include the lower voltage control signal circuitry as formerly practiced in connection with the previously described FIG. 3A and FIG. 3B embodiments. Such mechanical packaging of piezoceramic relay devices keeps the control circuitry physically and electrically separate from the load devices being actuated by the relay devices while still further isolating the control circuitry from damage if arc flashover should occur within the housing member. Additionally, the electrical schematic drawing in FIG. 9 which depicts the overall control circuitry operating all six (6) individual piezoceramic relay devices being employed in the illustrated appliance 115 features a particular circuit configuration whereby the maximum 15 watt power level can be achieved as well as maintained while still further incorporating circuit components which ameliorate arcing of the relay devices. In the latter regard, charging and discharging resistor elements are employed so as to open and close the relay contacts at different velocities in a manner more fully described in the aforementioned commonly assigned Ser. No. 173,502 application. These resistor values are selected to enable the rate of contact closure to be slowed and thereby reduce contact bounce whereas contact opening is made to occur at a faster rate to minimize arc energy.

FIG. 6 illustrates the power control system 120 for the above described dishwasher appliance 115 partly in simplified block diagram form. Accordingly, the depicted control system includes operatively associated user selection circuit means 122 which can be of the same type previously described in connection with the preceding FIG. 2 apparatus. Similarly, the presently depicted control system further includes function control circuit means 124 which are connected in circuit relationship to provide the electrical control signals to power switching circuit means 126. Selection by a user with the control knobs or touch control means 129 (best seen in FIG. 6A) located on a control panel 131 which are customarily provided in the conventional appliance 115 enable processing mode and processing conditions to be specified with DC control signals in the user selection circuit means 122 which are further processed in the function control circuit 124. The processed control signals are thereupon applied to further operatively associated power switching circuit means 126 enabling actuation of individual piezoceramic relay devices 128, 130, 132, 134, 136 and 138 for consequent connection of the power source to individual electrically actuated functional means contained in the illustrated dishwasher appliance 115. As can be noted in the drawing, an electric motor 140 which can be operated in connection with rotary wash arm means 117 provides one of the illustrated functional means whereas the remaining functional means 142, 144 and 146 constitute still other electrically actuated functional means identified by label in the drawing. As can be further noted in this regard, the "heater" device 146 employs a pair of relays (136 and 138) enabling interruption of both power conductors to the resistive heating element supplying this function in the appliance 115. It can be further noted that all remaining depicted relay means are each series connected to an individual electrically actuated functional means for independent control of the electrical power thereto. The relay means are further constructed and operated as hereinafter explained more fully in FIG. 7 so as to maintain the coacting contact means open or spaced apart when an individual piezoceramic bender member is in an unenergized condition but deflect and close the contacts to switch the associated functional means into operation responsive to the applied electrical control signals. Actuation of the individual relay means in this manner supplies the electrical power from power conductors N and L-1 which can be a conventional 115 volt AC power supply.

Figure 7:
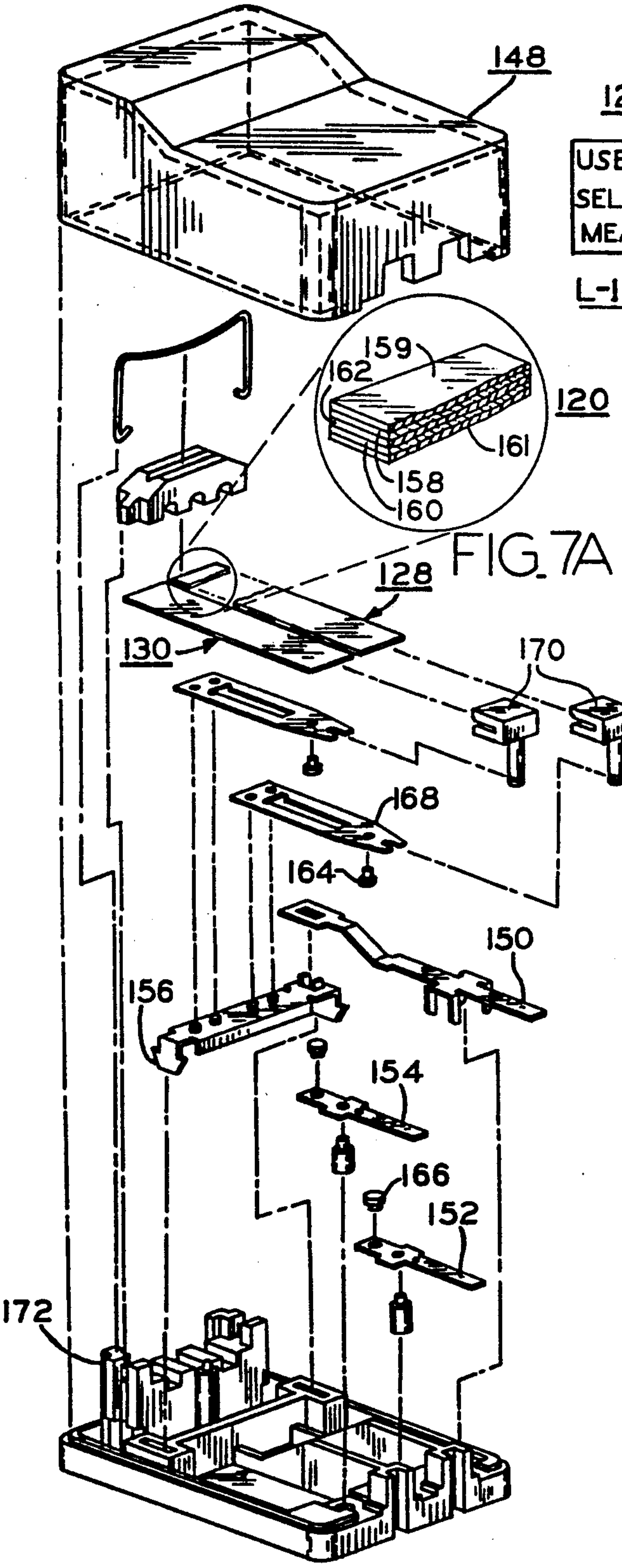
FIG. 7 is an exploded perspective view for the structural configuration of a pair of relay devices which can be employed in the FIG. 6 control means.

FIG. 7 provides a perspective view for the mechanical and electrical packaging of a pair of relay devices 128 and 130 as utilized in the FIG. 6 control system. Corresponding packaging means can similarly be employed for the remaining relay pairs (132-134 and 136-138). Accordingly, the relay devices 128 and 130 are enclosed within a box-like housing member 148 conveniently mounted on the control panel 131 customarily provided in a conventional dishwasher appliance 115 of the type being illustrated. Housing member 148 further includes a common input power terminal 150 to both relay devices 128 and 130 whereas individual output power terminals 152 and 154 from the repsective relay devices are also provided. An electrically conductive bridge member 156 connected to input terminal 150 supplies electrical power from the power source to the individual relay devices. As seen in FIG. 7A, each relay device is formed with a pair of prepolarized piezoceramic plate elements 158 and 160 secured in opposed parallel relationship sandwich fashion on opposite sides of at least one central conductive surface 162. A conductive surface 159 is provided on the outer planar surface of the plate element 158, and a conductive surface 161 is provided on the outer planar surface of the plate element 160. Such bender-type switching device further includes one pair of coacting contact means 164 and 166 which are closed by downward deflection of the polarized plate elements. As can be noted, movable contact element 164 is disposed upon an electrically conductive spring element 168 with both the movable bender member and the spring element being joined together with an insulating block element 170 for common movement. By further electrically connecting the spring element 168 to an individual output power terminal (152 or 154), the power source becomes connected to the associated functional means (not shown) upon closure of the coacting contact means. Each relay device together with its spring element is physically supported at the opposite end in a cantilever manner with common clamping means 172 which serve to both physically hold and clamp together the piezoceramic plate elements with the central conductive surface sandwich therebetween. Further internal terminal means not shown in the present drawing but comparable to terminals $T_3$, $T_4$ and $T_c$ in the previously described FIG. 3A and 3B embodiments again supply DC energizing potential across the polarized piezoceramic plate elements in response to the control signals.

Actuation of the foregoing piezoceramic relay devices in the manner described can be achieved with either "high drain" or "low drain" type control circuitry as previously indicated and as more fully explained in the following FIGS. 8–9 circuitry descriptions. Both type control circuits utilize the low power input control signals with further logic circuit means to apply the DC energizing potential to the individual relay devices in a particular manner. Specifically, one piezoceramic plate element is connected to a high voltage terminal, while the remaining plate element is connected to a lower common voltage terminal and the central conductive surface is switched between high voltage and common voltage levels. If a representative 300 volts DC is applied to the top bender plate element while the lower bender plate is held at a zero voltage level, the bender member can be caused to deflect downward with application of the 300 volts to the central conductive surface in one of the following switching circuit configurations. The bender member can be caused to deflect upwards employing such switching circuit means when the voltage level of the central conductive surface is caused to be at zero volts. The bender member being illustrated is caused to open the coacting contact pair due to the mechanical force being exercised by spring element 168 upon removing the DC energizing potential again all in response to the user preselected control signals. Thus, it will be apparent that the coacting contact pair remain spaced apart in a fail-safe manner of operation while the present relay devices are maintained in an unenergized condition. It will likewise be apparent that an electrical circuit is completed between the power source connected to the spring element 168 and the particular associated functional means connected to the coacting contact pair when the illustrated contacts are closed.

Figure 8:
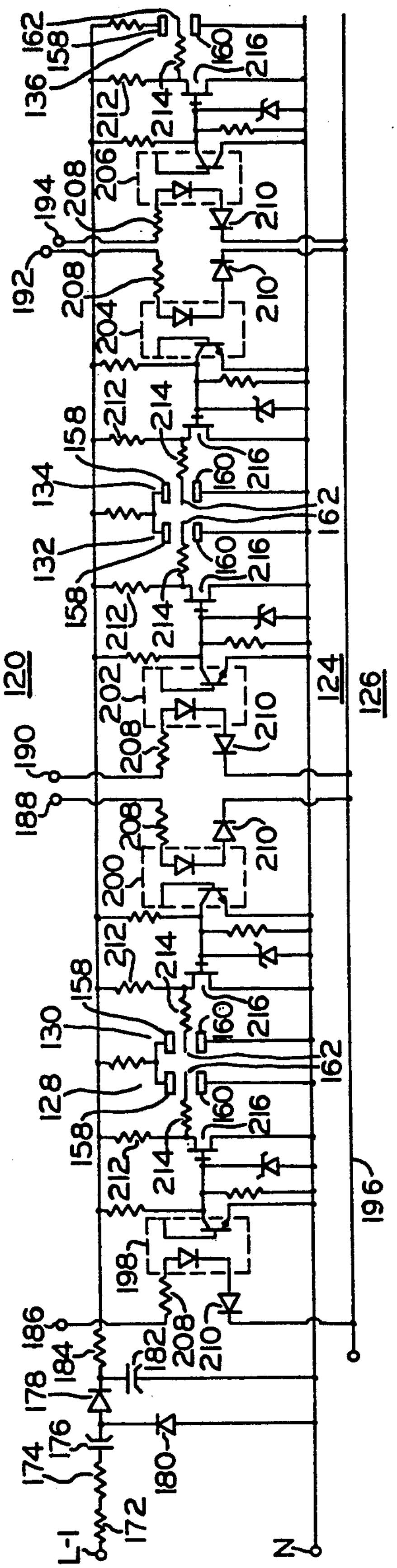
FIG. 8 is an electrical schematic diagram for a representative control circuit employed in the FIG. 6 control means.

FIG. 8 is an electrical schematic diagram representing one typical "high drain" control circuitry 120 which can be employed for actuation of the relay devices in the above described FIG. 6 embodiment. Accordingly, the same numeral identification has been retained in FIG. 8 to identify the same structural and circuit components previously identified for a greater ease of understanding. Control circuit means 120 thereby includes a solid state logic circuit 124 (depicted only partly in the present drawing with referenced circuit connections) which provides the user preselected control signals to high voltage power supply elements in the operatively associated switching circuit means 126 actuating the depicted relay devices. As can be noted, each of the depicted relays is connected in circuit relationship so that the cooperating polarized piezoceramic plate elements 158 and 160 are individually connected to power conductors L-1 and N, respectively, and with the further cooperating central conductive surface 162 being interconnected therebetween to enable the previously described voltage switching mode of bender operation to take place. A resistor diode network provided with circuit elements 172, 174, 176, 178, 180, 182 and 184 in the switching circuit means 126 forms a high voltage power supply developing the DC energizing potential to actuate all of the depicted relay devices. Application of the energizing potential to an individual relay device is made subject to control signals provided at individual input terminals 186–194 with operatively associated solid state logic circuit 124 shown only further in the present drawing with a common ground connection 196. The logic input control signals are applied in such manner to an individual relay device by means of commercially available "Opto isolator" devices 198–206 utilizing the further interconnected resistor 208 and diode 210 elements shown. With the top plate element 158 in the depicted relay devices being maintained at a high voltage level with respect to the bottom plate element 160, bender deflection is thereafter produced when the DC energizing potential is applied to the central conductive surface 162 as dictated by the associated logic control signals. In doing so, resistor elements 212 and 214 control charge and discharge of the central conductive surface 162 and with the DC energizing potential being applied by means of separate individual active devices 216 shown as discrete output FET type transistors. By reason of the "high drain" characteristic for the presently described control circuit embodiment and the consequent higher power requirements associated therewith, it is recognized that such circuit embodiment may not fully satisfy all of the aforementioned UL considerations. On the other hand, continued development in the materials and construction of piezoceramic relay devices can be expected to significantly improve performance in a manner further reducing power consumption in control systems utilizing such relay devices. Accordingly, the cost advantage of employing fewer circuit components in a "high drain" control circuit as compared with a "low drain" control circuit of equivalent performance may eventually be realized within the present limitations on control power levels.

Figure 9:
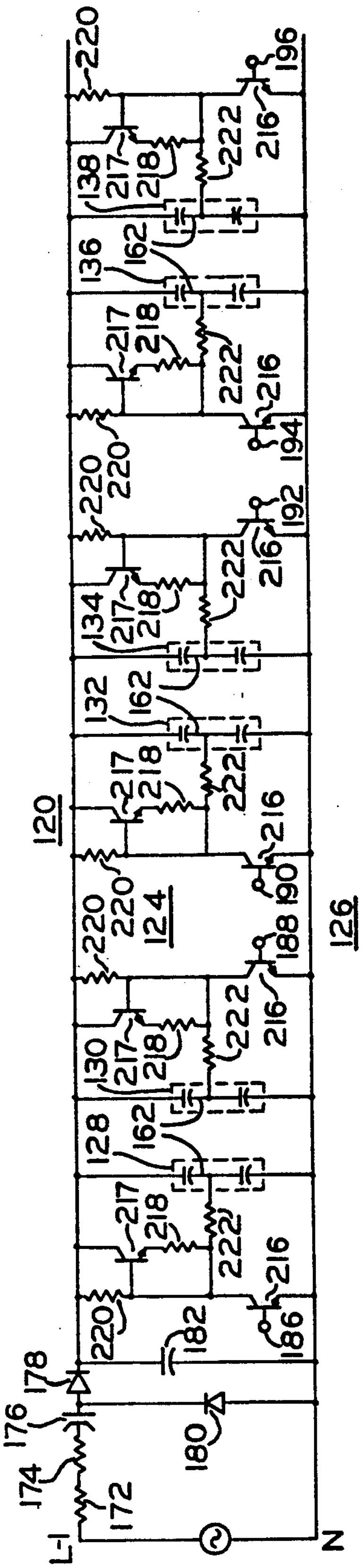
FIG. 9 is an electrical schematic diagram for a different control circuit which can be used in the FIG. 6 control means.

In FIG. 9 there is depicted a "low drain" type control circuit means 120 for actuation of the relay devices in the above described FIG. 6 embodiment. The same numeral identification employed in FIG. 8 has thereby been retained to the extent possible in identifying common circuit components. Moreover, the comparable operation for the individual relay devices in both control circuit embodiments obviates need of any detailed mention in connection with the present circuit description. Accordingly, the present control circuit means 120 again employs a solid state logic circuit 124 and which is depicted in the present drawing only with referenced logic input terminals 186–196. User preselected control signals processed in such logic control circuit means are thus applied to the operatively associated switching circuit means 126 to actuate the depicted relay devices 128–138 with DC energizing potential being applied to the individual relay devices from the L-1 and N power conductors shown. As further shown, the power supply can be a customary 115 volt AC household source and with the individual relay devices being connected in circuit relationship enabling selective deflection when the central conductive surface 162 of the selected relay device is switched between higher and lower DC voltage levels in response to the applied logic input control signals. A resistor diode network is again provided with circuit elements 172, 174, 176, 178, 180 and 182 to develop the DC energizing potential but which is now applied to an individual relay device with a pair of active devices 216 and 217 shown as NPN transistors. Both transistors are charged with resistor elements 218 and 222 controlling the charge rate to the respective transistor elements. As hereinbefore indicated, the "low drain" characteristic of the presently described control circuit embodiment enables full compliance with the aforementioned UL considerations. In this regard, it should be further appreciated that resistor elements 172 and 174 are series connected in both FIG. 8 and FIG. 9 circuit embodiments so that if one resistor fails as a short circuit, the remaining resistor element can still limit the applied power level. Such arrangement enables the FIG. 9 circuit embodiment to be maintained at a power level below the 15 watt limit commonly assigned by UL to household appliances.

It will be apparent from the foregoing description that a broadly useful power regulation system has been disclosed to enable more efficient operation of an article cleaning apparatus. It will also be apparent that modifications can be made in the specific methods, control means and controlled apparatus in the above disclosed preferred embodiments without departing from the spirit and scope of the present invention. For example, the specific control circuitry embodiments herein disclosed are equally suitable in an electric dishwashing apparatus, as well as an electric fabric drying apparatus. It can be further appreciated that various models exist for each of the herein disclosed fabric laundering, dishwashing and fabric drying apparatus with the simpler models being capable of power control only as distinct from any further temperature control means being utilized. On the other hand, it can also be recognized that still further control functions than above specifically disclosed can readily be programmed into the solid state logic circuit control means herein described for modified operation of the controlled apparatus. Consequently, it is intended to limit the present invention only by the scope of the appended claims.

What I claim as new and desire to secure by Letters Patent of the United States is:

1. Apparatus for controlling article cleaning equipment having at least two loads which are used to perform at least two operating cycles on the articles, the apparatus comprising:

(a) means for selecting at least two of the cycles;

(b) means for generating control signals to execute said selected operating cycles for predetermined time intervals; and (c) at least two piezoelectric relay means for providing electrical current to the loads in response to said control signals, said relay means having load contact means for providing and interrupting load currents to each of the loads, said relay means further having an open state in which said load contact means are open, and a closed state in which said load contact means are closed, said relay means beginning and ending said selected cycles by opening and closing said load contact means to provide and interrupt load currents in the equipment;

(d) said relay means further having means for switching application of an energizing potential to said relay means to change the state of said relay means when a single control signal is applied to said relay means or is terminated, (e) said relay means further including a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements, (f) said load contact means including a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without the use of flexible lead wire connections to said movable contact, so that said bender member and said spring means are connected for common movement by said insulating element, and said load contact means are opened at least in part by the electrical energization of said relay means and through the action of said bender member, said energization being applied when said control signal causes said relay means to change between said closed state and said open state, whereby said relay means are continuously energized to provide and interrupt said load currents.

2. The apparatus of claim 1 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

3. The apparatus of claim 1 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

4. The apparatus of claim 1 wherein said spring means is secured at one end to said clamping means and spaced from said planar surfaces of said plate elements, said spring means having a free end adjacent said bender end, said movable contact being secured to said free end for the conduction of load current through said movable contact and said spring means.

5. The apparatus of claim 1 wherein the article cleaning equipment is a clothes washing machine.

6. The apparatus of claim 1 wherein the article cleaning equipment is a dishwashing machine.

7. The apparatus of claim 1 wherein said relay means comprises a unitary body construction with at least two movable spaced apart fingerlike projections serving as the individual bender members.

8. The apparatus of claim 1 wherein said relay means comprises an electrically insulating base for supporting said plate elements, said spring means, and said load contact means, and cover means for protecting said plate elements, said spring means, and said second contact means against atmospheric contamination.

9. The apparatus of claim 1 comprising a common conductive strip for providing energizing potential to a selected one of said conductive surfaces in all of said plate elements.

10. Apparatus for controlling article cleaning equipment having at least two loads which are used to perform at least two operating cycles on the articles, the apparatus comprising:

(a) means for selecting at least two of the cycles;

(b) means for generating control signals to execute said selected operating cycles for predetermined time intervals; and (c) at least two piezoelectric relay means for providing electrical current to the loads in response to said control signals, said relay means having at least two piezoelectric bender members and load contact means for providing and interrupting load currents to each of the loads, said relay means further having an open state in which said load contact means are open, and a closed state in which said load contact means are closed, said relay means beginning and ending said selected cycles by opening and closing said load contact means to provide and interrupt load currents in the equipment;

(d) said load contact means further comprising a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without the use of flexible lead wire connections to said movable contact, so that said bender member and said spring means are connected for common movement by said insulating element, and said load contact means are opened at least in part by the electrical energization of said relay means and through the action of said bender member.

11. The apparatus of claim 10 wherein said bender member comprises a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements.

12. The apparatus of claim 11 wherein said spring means is secured at one end to said clamping means and spaced from said planar surfaces of said plate elements, said spring means having a free end adjacent said bender end, said movable contact being secured to said free end for the conduction of load current through said movable contact and said spring means.

13. The apparatus of claim 11 wherein said relay means comprises a unitary body construction with at least two movable spaced apart fingerlike projections serving as the individual bender members.

14. The apparatus of claim 11 wherein said relay means comprises an electrically insulating base for supporting said plate elements, said spring means, and said load contact means, and cover means for protecting said plate elements, said spring means, and said second contact means against atmospheric contamination.

15. The apparatus of claim 11 comprising a common conductive strip for providing energizing potential to a selected one of said conductive surfaces in all of said plate elements.

16. The apparatus of claim 10 wherein the article cleaning equipment is a clothes washing machine.

17. The apparatus of claim 10 wherein the article cleaning equipment is a dishwashing machine.

18. The apparatus of claim 6 wherein said relay means further comprises means for switching application of an energizing potential to said relay means to change the state of said relay means when a single control signal is applied to said relay means or is terminated, whereby said relay means are continuously energized to provide and interrupt said load currents.

19. The apparatus of claim 18 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

20. The apparatus of claim 18 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

21. Apparatus for washing clothes using at least two user-selected operating cycles, the apparatus comprising in combination:

(a) equipment means for performing the selected cycles on the articles, said equipment means having wash tub means for containing the clothes, agitator means in said tub for movement in said tub, and at least two electrical loads for moving said tub and said agitator, said loads being operated by load currents, and (b) means for operating said equipment means to execute the selected cycles for predetermined time intervals by controlling said load currents to said loads;

(c) said operating means including (i) means for selecting at least two of the operating cycles by providing electrical current to selected said loads in said equipment means for said predetermined time intervals;

(ii) means for generating control signals to execute said selected operating cycles; and (iii) at least two piezoelectric relay means responsive to said control signals, said relay means having load contact means for providing and interrupting load currents to each of said loads, said relay means further having an open state in which said load contact means are open, and a closed state in which said load contact means are closed, said relay means beginning and ending said selected cycles by opening and closing said load contact means to provide and interrupt load currents in the equipment;

(iv) said relay means further having means for switching application of an energizing potential to said relay means to change the state of said relay means when a single control signal is applied to said relay means or is terminated, (v) said relay means further including a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements, (vi) said load contact means including a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without the use of flexible lead wire connections to said movable contact, so that said bender member and said spring means are connected for common movement by said insulating element, and said load contact means are opened at least in part by the electrical energization of said relay means and through the action of said bender member, said energization being applied when said control signal causes said relay means to change between said closed state and said open state, whereby said relay means are continuously energized to provide and interrupt said load currents.

22. The apparatus of claim 21 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to change in said single control signal.

23. The apparatus of claim 21 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

24. The apparatus of claim 21 wherein said spring means is secured at one end to said clamping means and spaced from said planar surfaces of said plate elements, said spring means having a free end adjacent said bender end, said movable contact being secured to said free end for the conduction of load current through said movable contact and said spring means.

25. The apparatus of claim 21 wherein said relay means comprises a unitary body construction with at least two movable spaced apart fingerlike projections serving as the individual bender members.

26. The apparatus of claim 21 wherein said relay means comprises an electrically insulating base for supporting said plate elements, said spring means, and said load contact means, and cover means for protecting said plate elements, said spring means, and said second contact means against atmospheric contamination.

27. The apparatus of claim 21 comprising a common conductive strip for providing energizing potential to a selected one of said conductive surfaces in all of said plate elements.

28. Apparatus for washing clothes using at least two user-selected operating cycles, the apparatus comprising in combination:

(a) equipment means for performing the selected cycles on the articles, said equipment means having wash tub means for containing the clothes, agitator means in said tub for movement in said tub, and at least two electrical loads for moving said tub and said agitator, said loads being operated by load currents, and (b) means for operating said equipment means to execute the selected cycles for predetermined time intervals by controlling said load currents to said loads;

(c) said operating means including (i) means for selecting at least two of the operating cycles by providing electrical current to selected loads in the equipment for predetermined time intervals;

(ii) means for generating control signals to execute said selected operating cycles; and (iii) at least two piezoelectric relay means responsive to said control signals, said relay means having at least two piezoelectric bender members and load contact means for providing and interrupting load currents to each of said loads, said relay means further having an open state in which said load contact means are open, and a closed state in which said load contact means are closed, said relay means beginning and ending said selected cycles by opening and closing said load contact means to provide and interrupt load currents in the equipment;

(d) said load contact means further comprising a fixed contact and a movable contact, said relay means further including an insulating element for electrically isolating said bender member from said load contact means and configured for moving said bender member and said movable contact in unison, said movable contact being electrically connected to a selected load by an electrically conductive resilient spring means, without flexible lead wire connections to said movable contact, so that said bender member and said spring means are connected for common movement by said insulating element, and said load contact means are opened at least in part by the electrical energization of said relay means and through the action of said bender member.

29. The apparatus of claim 28 wherein said bender member comprises a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements.

30. The apparatus of claim 29 wherein said spring means is secured at one end to said clamping means and spaced from said planar surfaces of said plate elements, said spring means having a free end adjacent said bender end, said movable contact being secured to said free end for the conduction of load current through said movable contact and said spring means.

31. The apparatus of claim 29 wherein said relay means comprises a unitary body construction with at least two movable spaced apart fingerlike projections serving as the individual bender members.

32. The apparatus of claim 29 wherein said relay means comprises an electrically insulating base for supporting said plate elements, said spring means, and said load contact means, and cover means for protecting said plate elements, said spring means, and said second contact means against atmospheric contamination.

33. The apparatus of claim 29 comprising a common conductive strip for providing energizing potential to a selected one of said conductive surfaces in all of said plate elements.

34. The apparatus of claim 28 wherein said relay means further comprises means for switching application of an energizing potential to said relay means to change the state of said relay means when a single control signal is applied to said relay means or is terminated, whereby said relay means are continuously energized to provide and interrupt said load currents.

35. The apparatus of claim 34 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

36. The apparatus of claim 34 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

37. Apparatus for washing dishes and other eating utensils or articles using at least two user-selected operating cycles, the apparatus comprising in combination:

(a) equipment means for performing the selected cycles on the articles, said equipment means having rotatable wash arm means, means for dispensing a cleaning agent, and at least two electrical loads for rotating said wash arm means and dispensing said cleaning agent, and (b) means for operating said equipment means to execute the selected cycles for predetermined time intervals by controlling said load currents to said loads;

(c) said operating means including (i) means for selecting at least two of the operating cycles by providing electrical current to selected said loads in said equipment means for said predetermined time intervals;

(ii) means for generating control signals to execute said selected operating cycles; and (iii) at least two piezoelectric relay means responsive to said control signals, said relay means having load contact means for providing and interrupting load currents to each of said loads, said relay means further having an open state in which said load contact means are open, and a closed state in which said load contact means are closed, said relay means beginning and ending said selected cycles by opening and closing said load contact means to provide and interrupt load currents in the equipment;

(iv) said relay means further having means for switching application of an energizing potential to said relay means to change the state of said relay means when a single control signal is applied to said relay means or is terminated, (v) said relay means further including a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements, (vi) said load contact means including a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without the use of flexible lead wire connections to said movable contact, so that said bender member and said spring means are connected for common movement by said insulating element, and said load contact means are opened at least in part by the electrical energization of said relay means and through the action of said bender member, said energization being applied when said control signal causes said relay means to change between said closed state and said open state, whereby said relay means are continuously energized to provide and interrupt said load currents.

38. The apparatus of claim 37 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

39. The apparatus of claim 37 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

40. The apparatus of claim 37 wherein said spring means is secured at one end to said clamping means and spaced from said planar surfaces of said plate elements, said spring means having a free end adjacent said bender end, said movable contact being secured to said free end for the conduction of load current through said movable contact and said spring means.

41. The apparatus of claim 37 wherein said relay means comprises a unitary body construction with at least two movable spaced apart fingerlike projections serving as the individual bender members.

42. The apparatus of claim 37 wherein said relay means comprises an electrically insulating base for supporting said plate elements, said spring means, and said load contact means, and cover means for protecting said plate elements, said spring means, and said second contact means against atmospheric contamination.

43. The apparatus of claim 37 comprising a common conductive strip for providing energizing potential to a selected one of said conductive surfaces in all of said plate elements.

44. Apparatus for washing dishes and other eating utensils or articles using at least two user-selected operating cycles, the apparatus comprising in combination:

(a) equipment means for performing the selected cycles on the articles, said equipment means having rotatable wash arm means, means for dispensing a cleaning agent, and at least two electrical loads for rotating said wash arm means and dispensing said cleaning agent, and (b) means for operating said equipment means to execute the selected cycles for predetermined time intervals by controlling said load currents to said loads;

(c) said operating means including (i) means for selecting at least two of the operating cycles by providing electrical current to selected loads in the equipment for predetermined time intervals;

(ii) means for generating control signals to execute said selected operating cycles; and (iii) at least two piezoelectric relay means responsive to said control signals, said relay means having at least two piezoelectric bender members and load contact means for providing and interrupting load currents to each of said loads, said relay means further having an open state in which said load contact means are open, and a closed state in which said load contact means are closed, said relay means beginning and ending said selected cycles by opening and closing said load contact means to provide and interrupt load currents in the equipment;

(d) said load contact means further comprising a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without flexible lead wire connections to said movable contact, so that said bender member and said spring means are connected for common movement by said insulating element, and said load contact means are opened at least in part by the electrical energization of said relay means and through the action of said bender member.

45. The apparatus of claim 44 wherein said bender member comprises a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements.

46. The apparatus of claim 45 wherein said spring means is secured at one end to said clamping means and spaced from said planar surfaces of said plate elements, said spring means having a free end adjacent said bender end, said movable contact being secured to said free end for the conduction of load current through said movable contact and said spring means.

47. The apparatus of claim 45 wherein said relay means further comprises means for switching application of an energizing potential to said relay means to change the state of said relay means when a single control signal is applied to said relay means or is terminated, whereby said relay means are continuously energized to provide and interrupt said load currents.

48. The apparatus of claim 47 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

49. The apparatus of claim 47 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

50. The apparatus of claim 45 wherein said relay means comprises a unitary body construction with at least two movable spaced apart fingerlike projections serving as the individual bender members.

51. The apparatus of claim 45 wherein said relay means comprises an electrically insulating base for supporting said plate elements, said spring means, and said load contact means, and cover means for protecting said plate elements, said spring means, and said second contact means against atmospheric contamination.

52. The apparatus of claim 45 comprising a common conductive strip for providing energizing potential to a selected one of said conductive surfaces in all of said plate elements.

53. Apparatus for controlling article drying equipment having at least two loads which are used to perform at least two operating modes on articles to be dried, the apparatus comprising:

(a) means for selecting at least two of the modes;

(b) means for generating control signals to execute said selected operating modes for predetermined time intervals; and (c) at least two piezoelectric relay means for providing electrical current to the loads in response to said control signals, said relay means having at least two piezoelectric bender members and load contact means for providing and interrupting load currents to each of the loads, said relay means further having an open state in which said load contact means are open, and a closed state in which said load contact means are closed, said relay means beginning and ending said selected modes by opening and closing said load contact means to provide and interrupt load currents in the equipment;

(d) said load contact means further comprising a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without the use of flexible lead wire connections to said movable contact, so that said bender member and said spring means are connected for common movement by said insulating element, and said load contact means are opened at least in part by the electrical energization of said relay means and through the action of said bender member.

54. The apparatus of claim 53 wherein said bender member comprises a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements.

55. The apparatus of claim 53 wherein said spring means is secured at one end to said clamping means and spaced from said planar surfaces of said plate elements, said spring means having a free end adjacent said bender end, said movable contact being secured to said free end for the conduction of load current through said movable contact and said spring means.

56. The apparatus of claim 54 wherein said relay means comprises a unitary body construction with at least two movable spaced apart fingerlike projections serving as the individual bender members.

57. The apparatus of claim 54 wherein said relay means comprises an electrically insulating base for supporting said plate elements, said spring means, and said load contact means, and cover means for protecting said plate elements, said spring means, and said second contact means against atmospheric contamination.

58. The apparatus of claim 54 comprising a common conductive strip for providing energizing potential to a selected one of said conductive surfaces in all of said plate elements.

59. The apparatus of claim 53 wherein said relay means further comprises means for switching application of an energizing potential to said relay means to change the state of said relay means when a single control signal is applied to said relay means or is terminated, whereby said relay means are continuously energized to provide and interrupt said load currents.

60. The apparatus of claim 59 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

61. The apparatus of claim 59 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

62. Apparatus for drying clothes using at least two user-selected operating modes the apparatus comprising in combination:

(a) equipment means for performing the selected modes on the clothes, said equipment means having rotating drum means for containing the clothes, drive means for rotating said drum means, and means for heating the clothes in said drum means, said drive means and said heating means including electrical loads which are operated by load currents, and (b) means for operating said equipment means to execute the selected modes for predetermined time intervals by controlling said load currents to said loads;

(c) said operating means including (i) means for selecting at least two of the operating modes by providing electrical current to selected said loads in said equipment means for said predetermined time intervals;

(ii) means for generating control signals to execute said selected operating modes; and (iii) at least two piezoelectric relay means responsive to said control signals, said relay means having load contact means for providing and interrupting load currents to each of said loads, said relay means further having an open state in which said load contact means are open, and a closed state in which said load contact means are closed, said relay means beginning and ending said selected modes by opening and closing said load contact means to provide and interrupt load currents in the equipment;

(iv) said relay means further having means for switching application of an energizing potential to said relay means to change the state of said relay means when a single control signal is applied to said relay means or is terminated, (v) said relay means further including a pair of planar piezoelectric plate elements secured in opposed parallel relationship sandwich fashion on opposite sides of a central conductive surface, with conductive surfaces on the outer planar surfaces of said plate elements, said plate elements being secured by clamping means for movement of a bender end of the plate elements by applying said energizing potential to one of said plate elements, (vi) said load contact means further comprising a fixed contact and a movable contact, said relay means further including an insulating element for electrically isolating said bender member from said load contact means and configured for moving said bender member and said movable contact in unison, said movable contact being electrically connected to a selected load by electrically conductive resilient spring means, without flexible lead wire connections to said movable contact, so that said bender member and said spring means are connected for common movement by said insulating element, and said load contact means are opened at least in part by the electrical energization of said relay means and through the action of said bender member, whereby said relay means are continuously energized to provide and interrupt said load currents.

63. The apparatus of claim 62 wherein said switching means comprises means for retaining said central conductive surface as an electrically common terminal, and means responsive to said single control signal for switching application of the energizing potential from one of said plate elements to the other of said plate elements to cause said bender member to deflect in opposite directions when said energizing potential is switched from one plate element to the other, in response to changes in said single control signal.

64. The apparatus of claim 62 wherein said switching means comprises means for retaining one of said outer conductors at a high potential, means for retaining the other of said outer conductive surfaces at a low potential, and means responsive to said single control signal for switching said central conductive surface between the high and low potentials, causing said bender member to deflect in opposite directions when said energizing potential is switched from one plate element to the other, in response to changes in said single control signal.

65. The apparatus of claim 62 wherein said spring means is secured at one end to said clamping means and spaced from said planar surfaces of said plate elements, said spring means having a free end adjacent said bender end, said movable contact being secured to said free end for the conduction of load current through said movable contact and said spring means.

66. The apparatus of claim 62 wherein said relay means comprises a unitary body construction with at least two movable spaced apart fingerlike projections serving as the individual bender members.

67. The apparatus of claim 62 wherein said relay means comprises an electrically insulating base for supporting said plate elements, said spring means, and said load contact means, and cover means for protecting said plate elements, said spring means, and said second contact means against atmospheric contamination.

68. The apparatus of claim 62 comprising a common conductive strip for providing energizing potential to a selected one of said conductive surfaces in all of said plate elements.

* * * * *